US010833068B2

(12) United States Patent
Tsubaki et al.

(10) Patent No.: US 10,833,068 B2
(45) Date of Patent: Nov. 10, 2020

(54) SEMICONDUCTOR DEVICE

(71) Applicant: ROHM CO., LTD., Kyoto (JP)

(72) Inventors: Akihiko Tsubaki, Kyoto (JP); Kanako Deguchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/357,962

(22) Filed: Mar. 19, 2019

(65) Prior Publication Data

US 2019/0304969 A1  Oct. 3, 2019

(30) Foreign Application Priority Data

Mar. 29, 2018 (JP) .................................. 2018-063618

(51) Int. Cl.
| | |
|---|---|
| *H01L 27/06* | (2006.01) |
| *H01L 29/861* | (2006.01) |
| *H01L 49/02* | (2006.01) |
| *H01L 29/732* | (2006.01) |
| *H01L 27/02* | (2006.01) |

(52) U.S. Cl.
CPC ...... *H01L 27/0664* (2013.01); *H01L 27/0248* (2013.01); *H01L 27/0658* (2013.01); *H01L 28/20* (2013.01); *H01L 29/732* (2013.01); *H01L 29/8611* (2013.01)

(58) Field of Classification Search
CPC ............ H01L 27/0664; H01L 27/0658; H01L 27/0647; H01L 27/0248; H01L 27/0259; H01L 29/73; H01L 29/732; H01L 29/7322; H01L 29/8611; H01L 21/82285; H01L 21/8249
See application file for complete search history.

(56) References Cited

U.S. PATENT DOCUMENTS

2001/0025963 A1* 10/2001 Tashiro .................. H01L 21/84
  257/173
2007/0272942 A1* 11/2007 Otake ................. H01L 29/7412
  257/139

FOREIGN PATENT DOCUMENTS

JP        10-209763        8/1998

* cited by examiner

*Primary Examiner* — Hsien Ming Lee
(74) *Attorney, Agent, or Firm* — Hamre, Schumann, Mueller & Larson, P.C.

(57) ABSTRACT

The present disclosure provides a semiconductor device that prevents a resistor component connected in series with a base electrode from the electrostatic damage. A semiconductor device includes, a collector layer, which is a first conductivity type semiconductor, a base layer, which is a second conductivity type semiconductor and connected with the collector layer, an emitter layer, which is the first conductivity type semiconductor and connected with the base layer, a first electrode, electrically connected to the base layer, a first resistor component, connected in series with the first electrode in a conductive path connecting the first electrode and the base layer, a second electrode, electrically connected to the emitter layer and the first resistor component; and a protection component, connected to the first electrode in parallel with the first resistor component, wherein the protection component comprises a pair of diodes formed by a pn junction and by a way of making both ends of the conductive path into a same polarity.

22 Claims, 28 Drawing Sheets

SEMICONDUCTOR DEVICE

PRIORITY CLAIM AND CROSS-REFERENCE

This patent application claims priority to Japan patent application Ser. No. 2018-063618, filed on Mar. 29, 2018, which is incorporated by reference in its entirety.

TECHNICAL FIELD

The present disclosure relates to a semiconductor device, in particular, the semiconductor device that comprises a bipolar transistor having a resistor component connected in series with a base electrode.

DISCUSSION OF THE BACKGROUND

For electronic devices such as portable terminals, a bipolar transistor operable under a relatively low base-emitter voltage is often used to reduce the power consumption. Patent literature 1 discloses an example of such bipolar transistors. In the bipolar transistor according to Patent literature 1, the resistor that switches the base-emitter voltage into the base current is connected in series with the base electrode. By using the resistor, compared with a relatively lower base-emitter voltage, the response of the outputted collector current becomes linear, and hence, the operation of the bipolar transistor is stable.

It is feasible to assemble the resistor that switches the base-emitter voltage into the base current into a semiconductor device together with the bipolar transistor. Such semiconductor devices are sometimes referred to as digital transistors. Such semiconductor device comprises a resistor component connected in series with the base electrode. The resistor component is often made from polycrystalline silicon in the form of thin films, and hence, it is more vulnerable to static charges. Consequently, there is a risk that the resistor component is damaged by static charges. If the resistor component was damaged, the response of the outputted collector current with respect to the base-emitter voltage would become non-linear, and therefore, the operation of the semiconductor device may become unstable or may be stopped.

PRIOR TECHNICAL LITERATURE

Patent Literature

[Patent literature 1] The specification of Japan patent application publication No. 10-209763.

SUMMARY

Problems to be Solved in the Present Invention

The problem to be solved in the present invention is as follows: in view of the foregoing, the present invention aims to provide a semiconductor device, in which the resistor component connected in series with the base electrode is protected from the electrostatic damage.

Technical Means for Solving Problems

The semiconductor device according to an embodiment of the present invention comprises, a collector layer, which is a first conductivity type semiconductor, a base layer, which is a second conductivity type semiconductor and connected with the collector layer, an emitter layer, which is the first conductivity type semiconductor and connected with the base layer, a first electrode, electrically connected to the base layer, a first resistor component, connected in series with the first electrode in a conductive path connecting the first electrode and the base layer, a second electrode, electrically connected to the emitter layer and the first resistor component, and a protection component, connected to the first electrode in parallel with the first resistor component, wherein the protection component comprises a pair of diodes formed by a pn junction and by a way of making both ends of the conductive path into a same polarity.

According to some preferred embodiments of the present invention, the structure of the semiconductor device further comprises an insulating layer, wherein the insulating layer is disposed at one side in the thickness direction, and is connected with the collector layer, the base layer and the emitter layer, and the first electrode is disposed on the insulating layer.

According to some preferred embodiments of the present invention, the structure of the semiconductor device further comprises a first wiring layer, wherein the first wiring layer is connected in series with the first resistor component and disposed on the insulating layer, and the first wiring layer is connected with the base layer.

According to some preferred embodiments of the present invention, wherein the material forming the first resistor component comprises polycrystalline silicon.

According to some preferred embodiments of the present invention, wherein the first electrode, when viewed in the thickness direction, overlaps with the base layer, and the protection component is disposed between the base layer and the first electrode in the thickness direction and is connected with the base layer and the first electrode.

According to some preferred embodiments of the present invention, wherein the protection component comprises, a contact, which is the second conductivity type semiconductor and is connected with the base layer; and a plurality of rings, which, when viewed in the thickness direction, surrounds the contact respectively, wherein, the plurality of the rings comprises, a plurality of first rings, which are the first conductivity type semiconductor; and a plurality of second rings, which are the second conductivity type semiconductor; and the plurality of the first rings and the plurality of the second rings are disposed alternately, wherein the innermost one of the plurality of the rings, when viewed in the thickness direction, is a first ring and connected with the contact portion, the outermost one of the plurality of the rings, when viewed in the thickness direction, is a second ring and connected with the first electrode and the first resistor component.

According to some preferred embodiments of the present invention, wherein the base layer comprises a portion of the protection component.

According to some preferred embodiments of the present invention, wherein the protection component is between the collector layer and the first electrode in the thickness direction and is connected with the first electrode, the semiconductor device further comprises a second wiring layer electrically connecting the protection component with the second electrode, and the second wiring layer is the second conductivity type semiconductor and comprises a portion of the protection component.

According to some preferred embodiments of the present invention, wherein, the protection component comprises, a contact, which is the second conductivity type semiconductor and is connected with the base layer; and a plurality of ring, which, when viewed in the thickness direction, surrounds the contact respectively, wherein, the plurality of the rings comprises, a plurality of first rings, which are the first conductivity type semiconductor, and a plurality of second rings, which are the second conductivity type semiconductor, wherein the plurality of the first rings and the plurality of the second rings are disposed alternately, wherein the innermost one of the plurality of the rings, when viewed in the thickness direction, is a first ring portion and connected with the contact portion, the outermost one of the plurality of the rings, when viewed in the thickness direction, is a second ring portion and connected with the second wiring layer.

According to some preferred embodiments of the present invention, wherein the second wiring layer comprises a band, which, when viewed in the thickness direction, intersects with the first wiring layer, wherein the band is covered by the insulating layer.

According to some preferred embodiments of the present invention, wherein the first resistor component and the protection component are covered by the insulating layer.

According to some preferred embodiments of the present invention, wherein the material forming the protection component comprises polycrystalline silicon.

According to some preferred embodiments of the present invention, wherein the protection component is connected with the collector layer, and the collector layer comprises a portion of the protection component.

According to some preferred embodiments of the present invention, wherein the auxiliary protection component is disposed between the protection component and the first electrode in the thickness direction and is connected with the protection component and the first electrode, the auxiliary protection component comprises an auxiliary contact, which is the first conductivity type semiconductor, and is connected with the protection component, and a plurality of auxiliary rings, which, when viewed in the thickness direction, surrounds the auxiliary contact respectively, wherein the plurality of the auxiliary rings comprises, a plurality of first auxiliary rings, which are the second conductivity type semiconductor; and a plurality of second auxiliary rings, which are the first conductivity type semiconductor, wherein the plurality of the first auxiliary rings and the plurality of the second auxiliary rings are disposed alternately, the innermost one of the auxiliary rings, when viewed in the thickness direction, is a first auxiliary ring portion and connected with the auxiliary contact portion, the outermost one of the auxiliary rings, when viewed in the thickness direction, is a first auxiliary ring and connected with the first electrode and the first resistor component.

According to some preferred embodiments of the present invention, wherein the first resistor component and the auxiliary protection component are covered by the insulating layer.

According to some preferred embodiments of the present invention, wherein the material of the auxiliary protection component comprises polycrystalline silicon.

According to some preferred embodiments of the present invention, the structure of the semiconductor device further comprises a second resistor component, wherein, the second resistor component is connected in series with the first resistor component, and is in a conductive path of the first resistor component and the second electrode, and the material forming the second resistor component comprises polycrystalline silicon.

According to some preferred embodiments of the present invention, the structure of the semiconductor device further comprises a third electrode, disposed at the other side in the thickness direction and electrically connected to the collector layer.

Effects of the Present Invention

The semiconductor devices according to the present invention may prevent the resistor component connected in series with the base electrode from the electrostatic damage.

Other characteristics and advantages of the present invention will be more apparent in view of the detailed description below and accompanying drawings.

DETAILED DESCRIPTION

Figure 1:
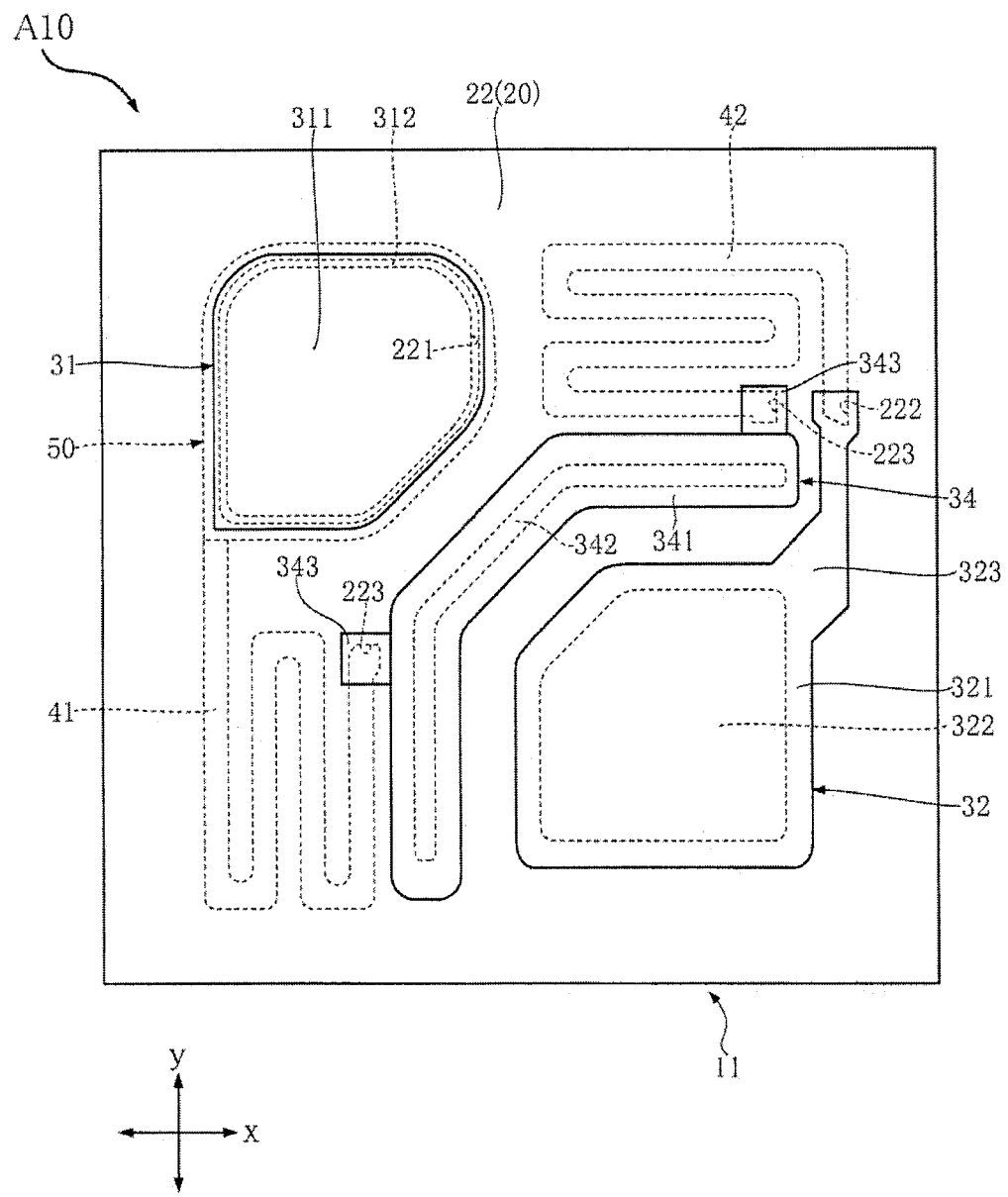
FIG. 1 is a top view of a semiconductor device according to the first embodiment of the present invention (seeing through the protection layer).

The present invention is described hereinbelow based on preferred embodiments thereof by referencing to the appended drawings.

First Embodiment

The semiconductor device A10 according to the first embodiment of the present invention is discussed with reference to FIG. 1 to FIG. 11. The semiconductor device A10 comprises a collector layer 11, a base layer 12, an emitter layer 13, a first electrode 31, a second electrode 32, a first resistor component 41 and a protection component 50. The semiconductor device A10 further comprises a substrate 10, an insulating layer 20, a third electrode 33, a first wiring layer 34, a second resistor component 42 and a protection layer 60. Moreover, to facilitate the discussion, in FIG. 1, the protection layer 60 is shown as being seen through, whereas in FIG. 2, the upper insulating layer 22 (which constituting a portion of the insulating layer 20, as the details will be discussed subsequently) and the protection layer 60 are shown as being seen through. In FIG. 3, the first electrode 31 is shown as being seen through. The see-through first electrode 31 in FIG. 3 is illustrated with a hypothetical line (two-dot chain line).

For the sake of convenience, when describing the semiconductor device A10, the thickness direction of the semiconductor device A10 is referred to as the "thickness direction z." A direction orthogonal to the thickness direction z is referred to as the "first direction x." A direction orthogonal to both the thickness direction z and the first direction x is referred to as the "second direction y." The first direction x corresponds to the horizontal direction in the top view. The second direction y corresponds to the vertical direction in the top view. Moreover, one side in the thickness direction z is the upper side in the cross sectional view. The other side in the thickness direction z is the lower side in the cross sectional view.

The semiconductor device A10 is a bipolar transistor in which the collector layer 11 and the emitter layer 13 have the same conductivity type. The semiconductor device A10 is vertical bipolar transistor. When viewed in the thickness direction z, the semiconductor device A10 has a rectangular shape. Herein the semiconductor device A10 is described as an npn junction-type bipolar transistor in the description of the semiconductor device A10. Alternatively, the semiconductor device A10 may be applied in a pnp junction-type bipolar transistor.

When describing the semiconductor device A10, the phrases "the first conductivity type semiconductor" and "the second conductivity type semiconductor" are used for the sake of convenience. In the case where the semiconductor device A10 is an npn junction type bipolar transistor, the semiconductor of the first conductivity type is an n-type semiconductor, and the semiconductor of the second conductivity type is a p-type semiconductor. In the case where the semiconductor device A10 is a pnp type bipolar transistor, the semiconductor of the first conductivity type is a p-type semiconductor, and the semiconductor of the second conductivity type is an n-type semiconductor. Herein the semiconductor device A10 in the following discussion is the aforementioned npn junction type bipolar transistor, thus accordingly, the first conductivity type semiconductor is the n-type semiconductor, and the second conductivity type semiconductor is the p-type semiconductor.

As shown in FIG. 5 and FIG. 7 to FIG. 9, the substrate 10 supports the collector layer 11 and the third electrode 33. The substrate 10 is made from the semiconductor material. The main semiconductor material comprises, for example, silicon (Si). When describing the semiconductor device A10, the main semiconductor material is silicon. The substrate 10 is a silicon wafer (used as the monocrystalline intrinsic semiconductor) doped with n-type dopants via ion implantation. Examples of said n-type dopant are antimony (Sb), arsenic (As) or phosphorus (P). Therefore, substrate 10 is a semiconductor of the first conductivity type.

As shown in FIG. 5 and FIG. 7 to FIG. 9, the collector layer 11 is disposed at one side of the substrate 10 in the thickness direction z. The collector layer 11 is formed by the following operations: laminating silicon, which is used as the intrinsic semiconductor, on the substrate 10 by epitaxial growth, and then doping n-type dopants into the silicon by ion implantation. Therefore, the collector layer 11 is a first conductivity type semiconductor. The concentration of the n-type dopant in the collector layer 11 is less than the concentration of the n-type dopant in the substrate 10. Conversely, the concentration of the n-type dopant in the substrate 10 is greater than the concentration of the n-type dopant in the collector layer 11. Therefore, in the cross sectional view, the first conductivity type semiconductor of the collector layer 11 is labeled as "n", whereas the first conductivity type semiconductor of the substrate 10 is labeled as "n+." The collector layer 11 has a collector primary face 11A that faces one side in the thickness direction z. The other side of the collector layer 11 in the other side of the thickness direction z is toward the substrate 10.

As shown in FIG. 5 to FIG. 9, the base layer 12 is connected with the collector layer 11. The base layer 12 is formed by the following operations: doping a portion of the collector layer 11 with p-type dopants via ion implantation. The p-type dopant is, for example, boron (B). Therefore, the base layer 12 is the layer formed by converting a portion of the collector layer 11 into a second conductivity type semiconductor. In the cross sectional view, the second conductivity type semiconductor of the base layer 12 is labeled as "p." The base layer 12 has a base primary face 12A facing one side in the thickness direction z. The base primary face 12A is coplanar with the collector primary face 11A of the collector layer 11. As shown in FIG. 2 and FIG. 5 to FIG. 9, the base layer 12 overlaps with the first electrode 31, when viewed in the thickness direction z. The maximum thickness of the base layer 12 is less than the maximum thickness of the collector layer 11.

Figure 9:
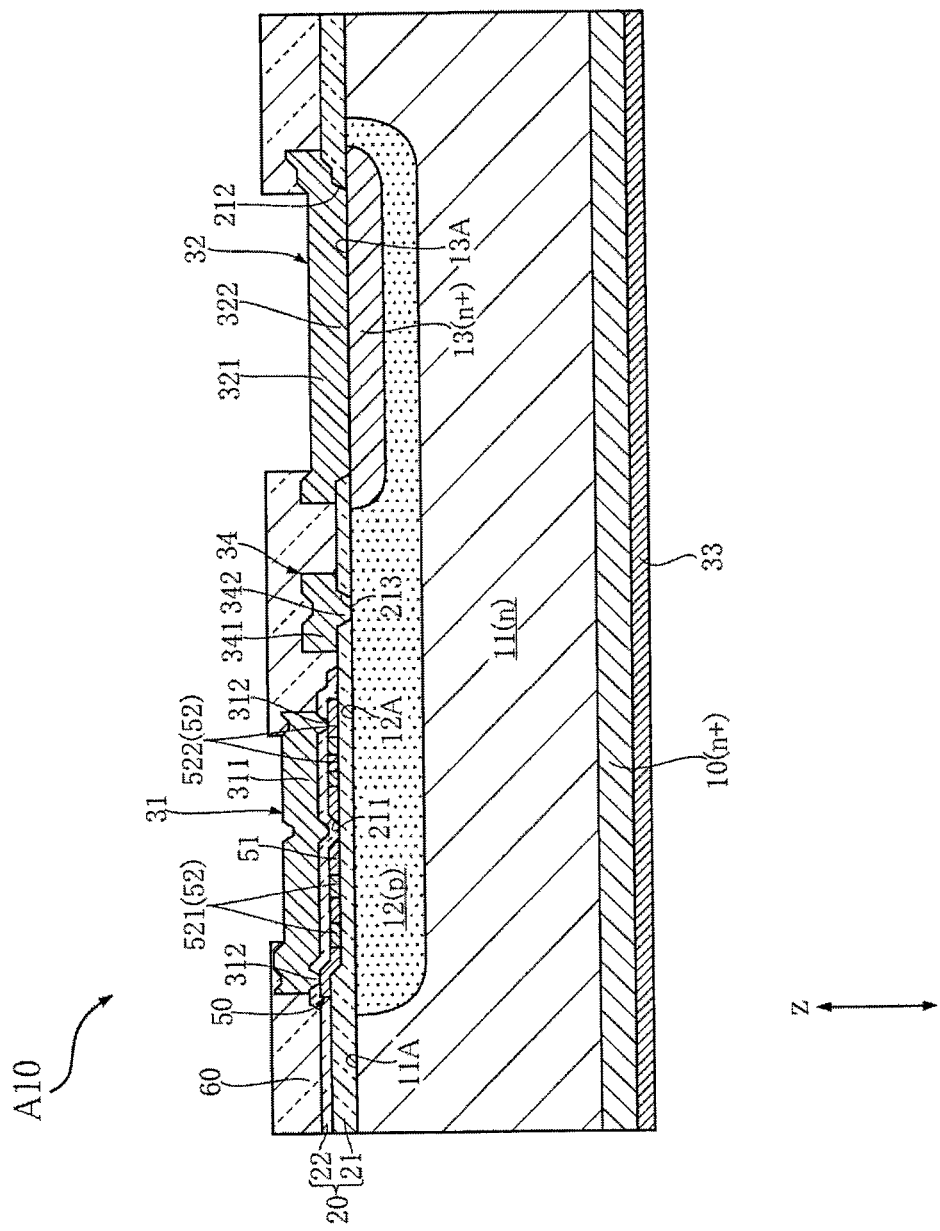
FIG. 9 is a cross sectional view taken along line IX-IX in FIG. 2.
Figure 10:
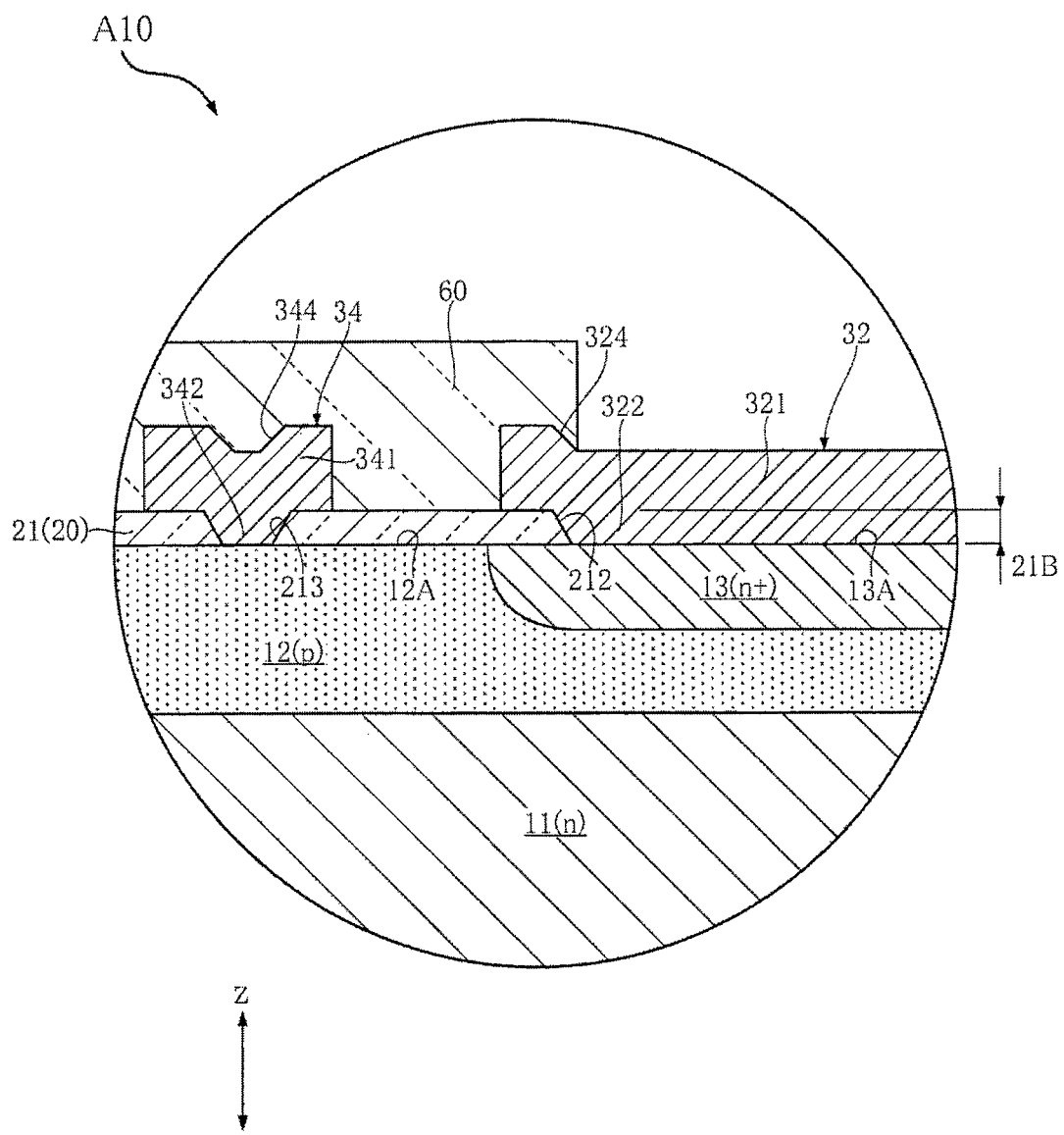
FIG. 10 is a partial enlargement view of FIG. 9.

As shown in FIG. 9 and FIG. 10, the emitter layer 13 is connected with the base layer 12. The emitter layer 13 is formed by the following operations: doping n-type dopants into a portion of the base layer 12 via ion implantation. Therefore, the emitter layer 13 is the layer formed by converting a portion of the base layer 12 into a first conductivity type semiconductor. The concentration of the n-type dopant in the emitter layer 13 is greater than the concentration of the n-type dopant in the collector layer 11. Therefore, in the cross sectional view, the first conductivity type semiconductor forming the emitter layer 13 is labeled as "n+." The emitter layer 13 has an emitter primary face 13A facing one side in the thickness direction z. The emitter primary face 13A is coplanar with the base primary face 12A of the base primary face 12A. Therefore, the collector primary face 11A of the collector layer 11, the base primary face 12A and the emitter primary face 13A are coplanar. The maximum thickness of the emitter layer 13 is less than the maximum thickness of the base layer 12.

As shown in FIG. 5 to FIG. 10, the insulating layer 20 is an electrical insulation component disposed at one side in the thickness direction z with respect to the collector layer 11. The insulating layer 20 is connected with the collector primary face 11A of the collector layer 11, the base primary face 12A of the base layer 12, and the emitter primary face 13A of the emitter layer 13. The insulating layer 20 is formed by a material of, such as, silicon dioxide ($SiO_2$). The insulating layer 20 includes a lower insulating layer 21 and an upper insulating layer 22.

Figure 6:
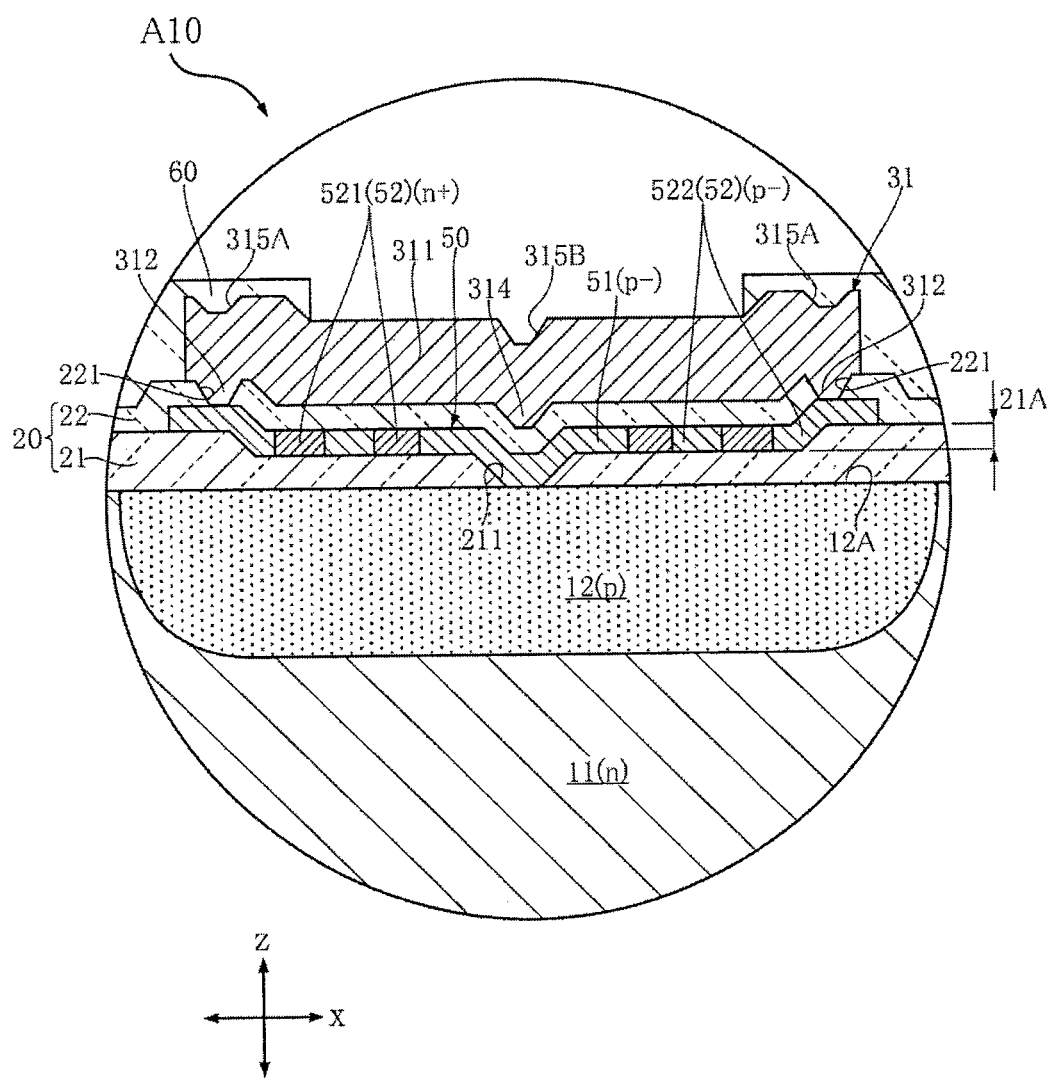
FIG. 6 is a partial enlargement view of FIG. 5.

As shown in FIG. 9, the lower insulating layer 21 is connected with the collector primary face 11A of the collector layer 11, the base primary face 12A of the base layer 12, and the emitter primary face 13A of the emitter layer 13. As shown in FIG. 6 and FIG. 9, a first step difference 21A and a second step difference 21B are formed at the lower insulating layer 21. The first step difference 21A and the second step difference 21B are the step differences with respect to the thickness direction z. The first step difference 21A is formed during the formation of the base layer 12. The second step difference 21B is formed during the formation of the emitter layer 13. The second step difference 21B is formed at the other side in the thickness direction z with respect to the first step difference 21A.

Figure 2:
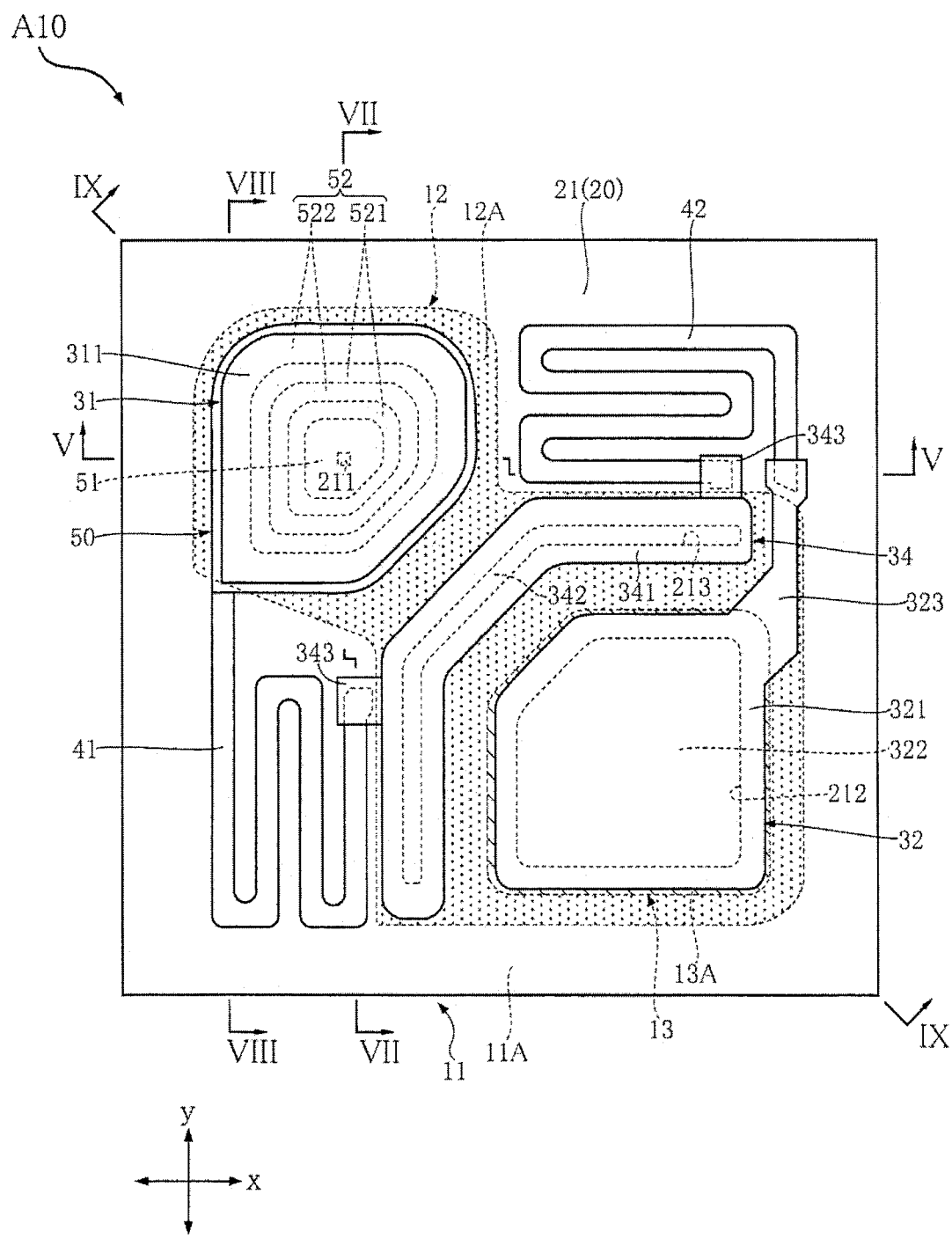
FIG. 2 is a top view of the semiconductor device shown in FIG. 1 (seeing through the upper insulating layer and protection layer).
Figure 3:
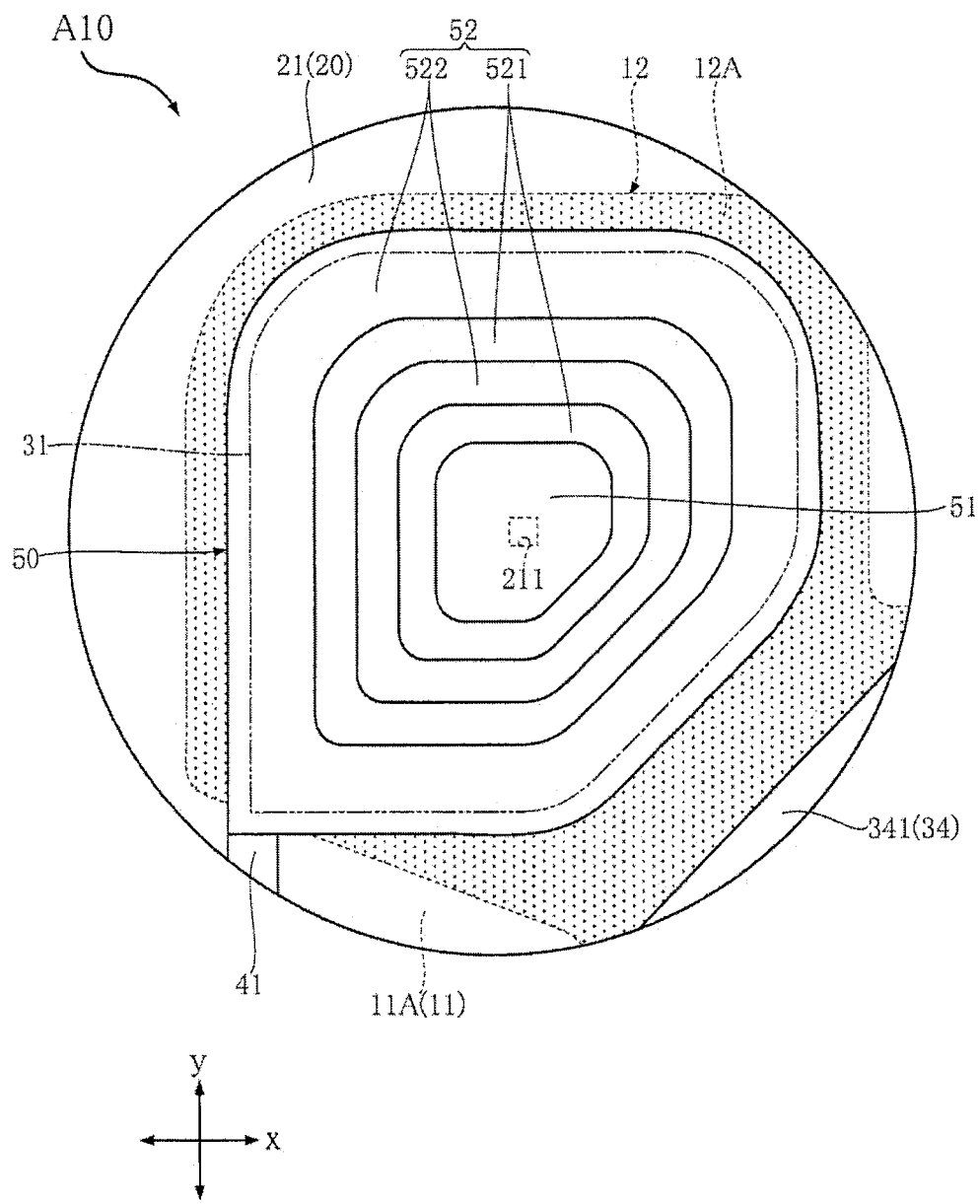
FIG. 3 is a partial enlargement view of FIG. 2 (seeing through the first electrode).

As shown in FIG. 2 and FIG. 9, a first lower opening 211, a second lower opening 212 and a third lower opening 213 are disposed at the lower insulating layer 21. The first lower opening 211, the second lower opening 212 and the third lower opening 213 penetrate through the lower insulating layer 21 along the thickness direction z. The first lower opening 211, when viewed in the thickness direction z, overlaps with the first electrode 31, and leads to the base primary face 12A of the base layer 12. The second lower opening 212, when viewed in the thickness direction z, overlaps with the second electrode 32, and leads to the emitter primary face 13A of the emitter layer 13. As shown in FIG. 10, the interface between the second lower opening 212 and emitter primary face 13A in the thickness direction z is surrounded by the second step difference 21B. The third lower opening 213, when viewed in the thickness direction z, overlaps with the first wiring layer 34, and opens toward the base primary face 12A. When viewed in the thickness direction z, the third lower opening 213 is in the shape of a belt extending along the first wiring layer 34.

Figure 5:
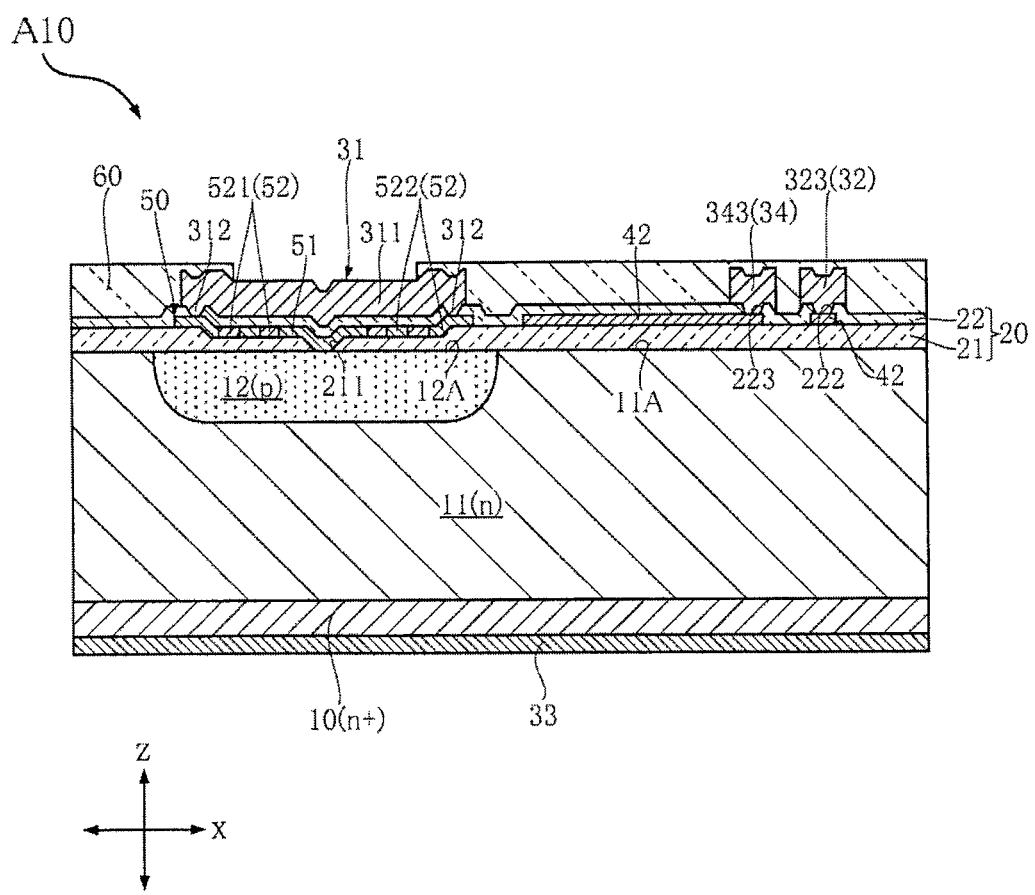
FIG. 5 is a cross sectional view taken along line V-V in FIG. 2.

As shown in FIG. 5 to FIG. 9, the upper insulating layer 22 is disposed over the lower insulating layer 21 in the thickness direction z. The upper insulating layer 22 covers at least a portion of the lower insulating layer 21. The upper insulating layer 22 is formed via plasma CVD (chemical vapor deposition). As shown in FIG. 1, FIG. 5 and FIG. 6, an first upper opening 221, an second upper opening 222 and a pair of third upper openings 223 are disposed at the upper insulating layer 22. The first upper opening 221, the second upper opening 222 and the pair of third upper openings 223 penetrate the upper insulating layer 22 along the thickness direction z. The first upper opening 221, when viewed in the thickness direction z, overlaps with the first electrode 31, and leads to the protection component 50. When viewed in the thickness direction z, the first upper opening 221 is in a ring shape. The second upper opening 222, when viewed in the thickness direction z, overlaps with the second electrode 32, and leads to the second resistor component 42. The pair of third upper openings 223, when viewed in the thickness direction z, overlap with the first wiring layer 34. One of the third upper openings 223 leads to the first resistor component 41. The other one of the third upper openings 223 leads to the second resistor component 42.

As shown in FIG. 5 to FIG. 9 and FIG. 11, the first electrode 31 is a conductive component electrically connected to the base layer 12 via the protection component 50. A forward voltage between the base layer 12 and the emitter layer 13 (the base-emitter voltage) is applied to the first electrode 31. In other words, the first electrode 31 is the base electrode of the semiconductor device A10. The first electrode 31 is disposed above the insulating layer 20 (the upper insulating layer 22). The material forming the first electrode 31 is, for example, aluminum (Al). The first electrode 31, when viewed in the thickness direction z, overlaps with the base layer 12. The first electrode 31 comprises a first terminal portion 311 and a first conductive portion 312.

As shown in FIG. 1, FIG. 2 and FIG. 5 to FIG. 9, the first terminal portion 311 forms the main body of the first electrode 31. One side of the first terminal portion 311 in the thickness direction z exposes from the semiconductor device A10. Bond wires and the like are connected at the portion of the first terminal portion 311 exposed from the semiconductor device A10.

As shown in FIG. 5 to FIG. 9 (except FIG. 8), the first conductive portion 312 protrudes from the other side of the first terminal portion 311 toward the protection component 50 in the thickness direction z. The first conductive portion 312 is connected with the protection component 50. In this manner, the first electrode 31 is electrically connected to the protection component 50. The first conductive portion 312 is disposed in the first upper opening 221 of the upper insulating layer 22. In this manner, as shown in FIG. 1, when being viewed in the thickness direction z, the first conductive portion 312 is in a ring-shape.

As shown in FIG. 6, a bump 314, a first recess 315A and a second recess 315B are disposed at the first electrode 31. The bump 314 protrudes from the other side of the first terminal portion 311 in the thickness direction z toward the protection component 50. In the thickness direction z, the upper insulating layer 22 is disposed between the protection component 50 and the bump 314. The bump 314, when viewed in the thickness direction z, is surrounded by the first conductive portion 312. The first recess 315A is recessed along the thickness direction z from one side of the first terminal portion 311 in the thickness direction z. The first recess 315A is in a ring-shape, when viewed in the thickness direction z, and has a portion that overlaps with the first conductive portion 312. The first recess 315A is formed during the formation of the first conductive portion 312. The second recess 315B is recessed along the thickness direction z from one side of the first terminal portion 311 in the thickness direction z. The second recess 315B is surrounded by the first recess 315A, when being viewed in the thickness direction z, and has a portion that overlaps with the bump 314. The second recess 315B is formed during the formation of the bump 314.

Figure 11:
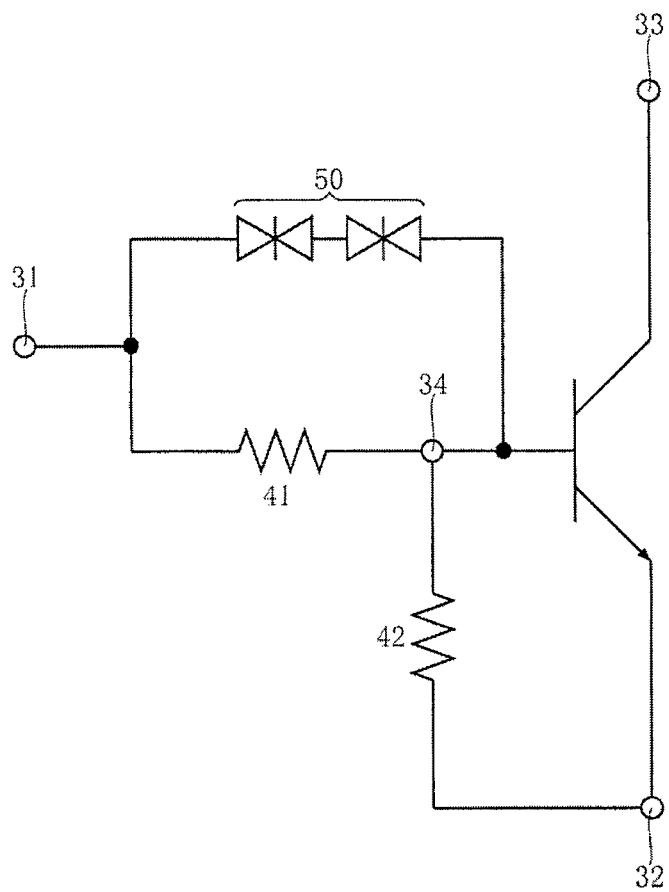
FIG. 11 is a circuit diagram of the semiconductor device shown in FIG. 1.

As shown in FIG. 9 to FIG. 11, the second electrode 32 is a conductive component electrically connected to the emitter layer 13 and the first resistor component 41. An emitter current flows through the second electrode 32. In other words, the second electrode 32 is an emitter electrode of the semiconductor device A10. The second electrode 32 is disposed above the emitter primary face 13A of the emitter layer 13. The material forming the second electrode 32 is, for example, aluminum. The second electrode 32 comprises a second terminal portion 321, a second conductive portion 322 and a second bonding pad portion 323.

As shown in FIG. 1, FIG. 2, FIG. 9 and FIG. 10, the second terminal portion 321 forms the main body of the second electrode 32. One side of the second terminal portion 321 in the thickness direction z exposes from the semiconductor device A10. Bond wires and the like are connected to the second terminal portion 321 exposed from the semiconductor device A10.

As shown in FIG. 9 and FIG. 10, the second conductive portion 322 protrudes from the other side of the second terminal portion 321 in the thickness direction z toward the emitter primary face 13A of the emitter layer 13. The second conductive portion 322 is connected with the emitter primary face 13A. In this manner, the second electrode 32 is electrically connected to the emitter layer 13. The second conductive portion 322 is disposed in the second lower opening 212 of the lower insulating layer 21.

As shown in FIG. 1 and FIG. 2, the second bonding pad portion 323 extends from a corner of the second terminal portion 321 toward the second direction y. As shown in FIG. 5, a portion of a front end of the second bonding pad portion 323 is disposed in the second upper opening 222 of the upper insulating layer 22, and is connected with the second resistor component 42. In this manner, the second electrode 32 is electrically connected to the second resistor component 42.

As shown in FIG. 10, a recess 324 is disposed at the second electrode 32. The recess 324 is recessed along the thickness direction z from one side of the second terminal portion 321 in the thickness direction z. The recess 324 comprises a portion that overlaps with the second conductive portion 322, when viewed in the thickness direction z. The recess 324 is formed during the formation of the second conductive portion 322.

Figure 4:
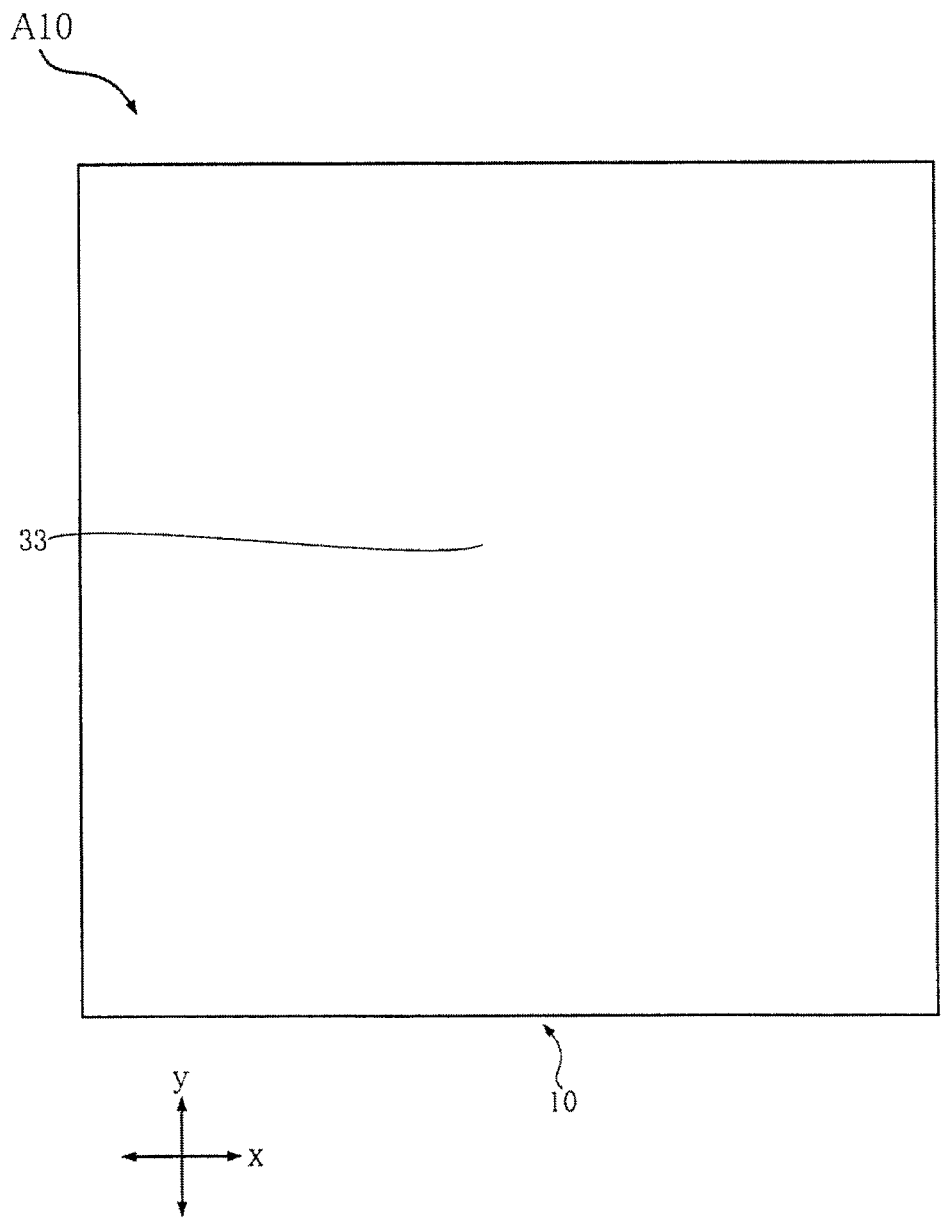
FIG. 4 is a bottom view of the semiconductor device shown in FIG. 1.

As shown in FIG. 4 and FIG. 9, the third electrode 33 is a conductive component disposed at the other side of the substrate 10 in the thickness direction z. The third electrode 33 is electrically connected to the collector layer 11 through the substrate 10. A reverse voltage between the collector layer 11 and the base layer 12 (the collector-base voltage) is applied to the third electrode 33, and a collector current outputted from the semiconductor device A10 flows therethrough. In other words, the third electrode 33 is a collector electrode of the semiconductor device A10. The third electrode 33 is electrically connected with a conductive component such as the wire. The third electrode 33 is formed by the following operations: laminating metal layer(s) on the substrate 10, for example, laminating only the gold (Au) on the substrate 10 or laminating titanium (Ti), nickel (Ni), and gold sequentially on the substrate 10.

Figure 7:
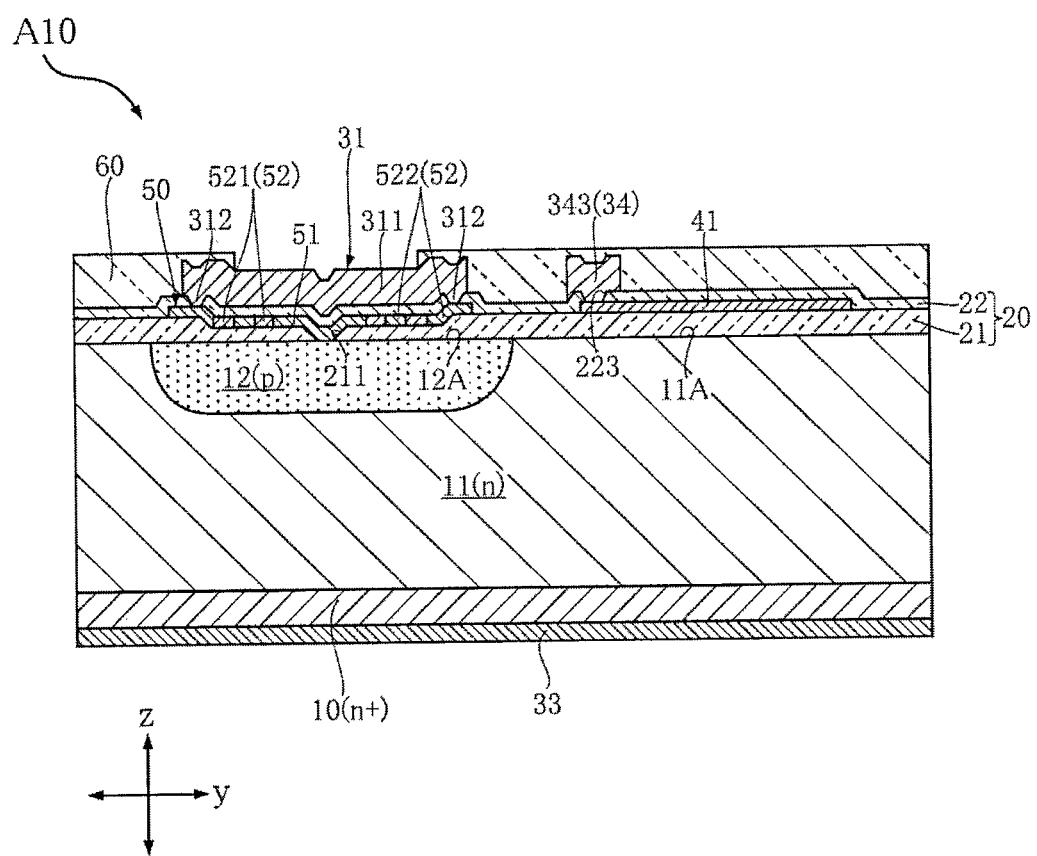
FIG. 7 is a cross sectional view taken along line VII-VII in FIG. 2.

As shown in FIG. 5, FIG. 7 and FIG. 9, the first wiring layer 34 is a conductive component disposed on the insulating layer 20. As shown in FIG. 11, the first wiring layer 34 is connected in series between the first resistor component 41 and the second resistor component 42, and is electrically connected to the base layer 12. The forward voltage applied between the base layer 12 of the first electrode 31 and the emitter layer 13 is converted into a base current via the first resistor component 41, the base current flows to the base layer 12 via the first wiring layer 34. The first wiring layer 34 is disposed on the insulating layer 20. The material forming the first wiring layer 34 is, for example, aluminum. The first wiring layer 34 comprises a main body 341, a third conductive portion 342 and a pair of third bonding pad portions 343.

As shown in FIG. 1, FIG. 2 and FIG. 9, the main body 341 constitutes the main body of the first wiring layer 34. The main body 341 is in the shape of a belt, when viewed in the thickness direction z, and is disposed between the first electrode 31 and the second electrode 32.

As shown in FIG. 9, the third conductive portion 342 protrudes from the other side of the main body 341 in the thickness direction z toward the base primary face 12A of the base layer 12. The third conductive portion 342 is connected with the base primary face 12A. In this way, the first wiring layer 34 is connected with and electrically conducted with the base layer 12. The third conductive portion 342 is disposed in the third lower opening 213 of the lower insulating layer 21.

As shown in FIG. 1 and FIG. 2, when viewed in the thickness direction z, a pair of third bonding pad portions 343 protrude from the main body 341. One of the third bonding pad portions 343 protrudes from the main body 341 along the first direction x. As shown in FIG. 7, a portion of one third bonding pad portion 343 is disposed in the third upper opening 223 that leads to the first resistor component 41, and connected with the first resistor component 41. As shown in FIG. 5, a portion of the other third bonding pad portion 343 is disposed in the third upper opening 223 that leads to the second resistor component 42, and connected with the second resistor component 42. In this manner, the first wiring layer 34 is connected in series between the first resistor component 41 and the second resistor component 42. Therefore, the second electrode 32 is electrically connecting to the first resistor component 41 via the second resistor component 42 and the first wiring layer 34.

As shown in FIG. 10, a recess 344 is disposed at the first wiring layer 34. The recess 344 is recessed along the thickness direction z from one side of the main body 341 in the thickness direction z. The recess 344 comprises a portion that overlaps with the third conductive portion 342, when viewed in the thickness direction z. The recess 344 is formed during the formation of the third conductive portion 342.

As shown in FIG. 11, a first resistor component 41 and a second resistor component 42 are disposed on a conductive path between the first electrode 31 and the second electrode 32. The first resistor component 41 is on a conductive path between the first electrode 31 and the base layer 12, and is connected in series with the first electrode 31. The first resistor component 41 converts the forward voltage applied between the base layer 12 and the emitter layer 13 of the first electrode 31 into a base current. In this way, as compared with a relatively lower base-emitter voltage, the response of the outputted collector current is linear; therefore, the operation of the semiconductor device A10 is stable. The second resistor component 42 is disposed on the conductive path between the first resistor component 41 and the second electrode 32, and is connected in series with first resistor component 41 through the first wiring layer 34. When a leak current or noise from the first electrode 31 is inputted into the first wiring layer 34, the second resistor component 42 directs it toward an external ground terminal electrically connected to the second electrode 32. In this way, it is feasible to prevent the leak current or noise from flowing toward the base layer 12, which in turn prevents the malfunction of the semiconductor device A10. Furthermore, as long as the semiconductor device A10 does not subject to the risk of malfunction during its operation, it is also feasible to form a structure without the second resistor component 42.

The material forming the first resistor component 41 and the second resistor component 42 comprises polycrystalline silicon. The first resistor component 41 and the second resistor component 42 is the polycrystalline silicon doped with the p-type dopant or n-type dopant. In this way, it is feasible to adjust the resistance of the first resistor component 41 and the second resistor component 42 to a desired level, respectively.

Figure 8:
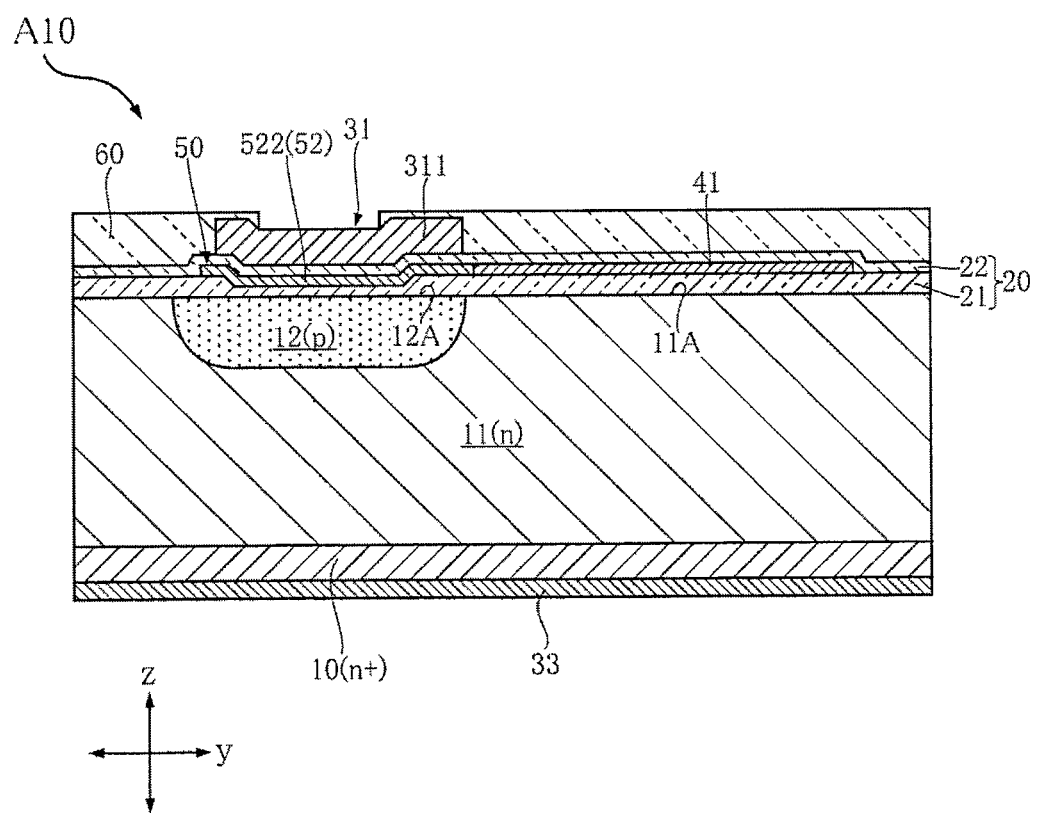
FIG. 8 is a cross sectional view taken along line VIII-VIII in FIG. 2.

As shown in FIG. 2, the first resistor component 41, when viewed in the thickness direction z, is in the shape of a meandering belt along the second direction y. As shown in FIG. 7 and FIG. 8, the first resistor component 41 is disposed on the lower insulating layer 21 and covered by the upper insulating layer 22. In this manner, the first resistor component 41 is covered by the insulating layer 20. One end of the first resistor component 41 is connected with the protection component 50. Another end of the first resistor component 41 is connected with one of the third bonding pad portions 343 of the first wiring layer 34. In this way, the first resistor component 41 is electrically connected to the protection component 50 and the first wiring layer 34.

As shown in FIG. 2, the second resistor component 42, when viewed in the thickness direction z, has a shape of a meandering belt along the second direction y. As shown in FIG. 5, the second resistor component 42 is disposed on the lower insulating layer 21, and covered by the upper insulating layer 22. In this way, the second resistor component 42 is covered by the insulating layer 20. One end of the second resistor component 42 is connected with the other third bonding pad portion 343 of the first wiring layer 34. The other end of the second resistor component 42 is connected with the second bonding pad portion 323 of the second electrode 32. In this way, the second resistor component 42 is electrically connected to the first wiring layer 34 and the second electrode 32.

As shown in FIG. 11, the protection component 50 is connected to the first electrode 31 in parallel with the first resistor component 41. In the thickness direction z, the protection component 50 is disposed between the base layer 12 and the first electrode 31. The protection component 50 is connected with the base layer 12 and the first electrode 31. In this manner, the protection component 50 is electrically connected to the base layer 12 and the first electrode 31. The protection component 50 is disposed on the lower insulating layer 21, and is covered by the upper insulating layer 22. In this manner, the protection component 50 is covered by the insulating layer 20. The material forming the protection component 50 comprises polycrystalline silicon. The protection component 50 may be polycrystalline silicon doped with the p-type dopant and n-type dopant. As shown in FIG. 3 and FIG. 6, the protection component 50 comprises a contact 51 and a plurality of rings 52.

As shown in FIG. 3 and FIG. 6, the contact 51, when viewed in the thickness direction z, is disposed at the center of the protection component 50. A portion of the contact 51 is disposed in the first lower opening 211 of the lower insulating layer 21. The portion of the contact 51 that is disposed in the first lower opening 211 is connected with the base primary face 12A of the base layer 12. The contact 51 is formed by the following operations: doping the p-type dopant into the polycrystalline silicon via ion implantation. Therefore, the contact portion 51 is a second conductivity type semiconductor. The concentration of the p-type dopant in the contact 51 is less than the concentration of the p-type dopant in the base layer 12. Therefore, in the cross sectional view, the semiconductor of the second conductivity type that forms the contact 51 is labeled as "p–".

As shown in FIG. 3 and FIG. 6, a plurality of rings 52, when being viewed in the thickness direction z, surround the contact 51, respectively. Said plurality of ring portions 52 comprises a plurality of first rings 521 and a plurality of second rings 522. The plurality of first rings 521 are formed by the following operations: doping the p-type dopant and n-type dopant into the polycrystalline silicon via ion implantation. In the plurality of first rings 521, the concentration of the n-type dopant is less than the concentration of the p-type dopant. Therefore, the plurality of first rings 521 are the first conductivity type semiconductors. Moreover, the concentration of the n-type dopant in the plurality of first rings 521 is greater than the concentration of the n-type dopant in the collector layer 11. The plurality of second rings 522 are formed by the following operations: doping the p-type dopant into the polycrystalline silicon via ion implantation. Therefore, the plurality of second rings 522 are the second conductivity type semiconductors. The concentration of the p-type dopant in the plurality of second rings 522 is less than the concentration of the p-type dopant in the base layer 12. Therefore, in the cross sectional view, the first conductivity type conductor that forms the plurality of first rings 521 is labeled as "n+", and the second conductivity type semiconductor that forms the plurality of second rings 522 is labeled as "p–".

As shown in FIG. 3 and FIG. 6, the plurality of rings 52, when viewed in the thickness direction z, comprises each of a plurality of first rings 521 and a plurality of second rings 522 that are alternately disposed. The adjacent first rings 521 and the second rings 522 are connected with each other. The innermost ring of the ring portion 52, when viewed in the thickness direction z, is a first ring 521. Such first ring 521 is connected with the contact 51. The outermost ring of the rings 52, when viewed in the thickness direction z, is a second ring portion 522. Such second ring 522 is connected with the first conductive portion 312 of the first electrode 31 and the first resistor component 41. In this manner, the first resistor component 41 is electrically connected to the first electrode 31 via the second ring 522. Therefore, the second electrode 32 is electrically connected to the first electrode 31 via the second resistor component 42, the first wiring layer 34, the first resistor component 41 and the second ring 522.

As shown in FIG. 6, when viewed in the thickness direction z, a pair of diodes formed by a pn junction in the protection component 50 by the second ring 522 disposed at the outermost, the first ring portion 521 adjacent to the inner periphery of the outermost second ring 522, and a second ring 522 adjacent to the inner periphery of the aforesaid first ring portion 521. Moreover, when viewed in the thickness direction z, a pair of diodes are formed by a pn junction in the protection component 50 by the contact 51, the first ring 521 connected with the contact 51, and the second ring portion 522 adjacent to the outer periphery of the first ring portion 521. These pairs of diodes respectively have a same polarity at two ends of its own conductive path. The polarity is anodic. Therefore, as shown in FIG. 11, in the semiconductor device A10, the protection component 50 comprises two sets of paired diodes formed by pn junction in which the two ends in its conductive path are made to have the same polarity. Said pairs of diodes are connected in series. The base layer 12 connected with the contact 51 and the contact 51 constitute a pair of diodes. Therefore, the base layer 12 also comprises a portion of the protection component 50.

As shown in FIG. 5 to FIG. 10, the protection layer 60 is an electrical insulation component disposed over one side in the thickness direction z with respect to the insulating layer 20. The protection layer 60 covers the insulating layer 20 and the first wiring layer 34. A portion of the first electrode 31 and a portion of the second electrode 32 are respectively covered by the protection layer 60. The protection layer 60 is formed by a material of, such as, silicon nitride ($Si_3N_4$). The protection layer 60 may also comprise polyimide, instead of silicon nitride.

Next, the effects of the semiconductor device A10 are discussed.

According to the structure of the semiconductor device A10, as shown in FIG. 11, it comprises the protection component 50 that is connected in series with the first electrode 31 with respect to the first resistor component 41. The protection component 50 comprises a pair of diodes formed by pn junction in which both ends in its conductive path are made to have the same polarity. In this manner, when the static electricity is applied to the first electrode 31, a reverse voltage is applied to one of the diode of the pair of diodes, wherein the first electrode 31 side is the cathode side of such diode. When the reverse voltage exceeds a certain level, the breakdown current flows to the diode in which the side of the first electrode 31 is cathodic. Consequently, the static electricity will not flow to the first resistor component 41, but instead to the protection component 50. Therefore, the present semiconductor device A10 can prevent the first resistor component 41 connected to the first electrode 31 (the base electrode) from being damaged by the electrostatic.

The semiconductor device A10 comprises a first wiring layer 34 connected in series between the first resistor component 41 and the second resistor component 42. The first wiring layer 34 is connected to the base layer 12. In this manner, the base current converted by the first resistor component 41 is flowed to the base layer 12, and the leak current or noise from the first electrode 31 may not flow to the base layer 12 but instead to the second resistor component 42.

In the semiconductor device A10, the protection component 50 is electrically connected to the base layer 12 and the first electrode 31. In this way, the static electricity applied to the first electrode 31 will arrive at the second electrode 32 via the protection component 50, the base layer 12 and the emitter layer 13. The static electricity arriving at the second electrode 32 flows to an external ground terminal electrically connected to the second electrode 32. Therefore, the static electricity applied to the first electrode 31 will not flow to the first resistor component 41 and the second resistor component 42 but instead will be discharged via the external ground terminal.

In the semiconductor device A10, the first electrode 31 overlaps with the base layer 12, when viewed in the thickness direction z. In the thickness direction z, the protection component 50 is disposed between the base layer 12 and the first electrode 31. In this way, the conductive path of the protection component 50 from the first electrode 31 to the base layer 12 can be reduced to a great extent.

In the semiconductor device A10, the protection component 50 comprises a contact 51 and a plurality of rings. The contact 51 is a second conductivity type semiconductor, and is connected with the base layer 12. The plurality of rings 52, when viewed in the thickness direction z, respectively surrounds the contact 51. The plurality of ring portions 52 comprises a plurality of first rings 521 of the first conductivity type semiconductor and a plurality of second rings 522 as the second conductivity type semiconductor disposed alternately. In this way, it is feasible to increase the number of the pair of diodes comprised in the protection component 50. Therefore, the tolerance of the first resistor component 41 to the electrostatic damage may be increased.

The Second Embodiment

The semiconductor device A20 according to the second embodiment of the present invention is discussed with reference to FIG. 12 to FIG. 18. In these drawings, elements the same as or similar to those described above in connection with semiconductor device A10 are denoted as the same reference numerals, and repetitive description is omitted. Furthermore, to facilitate the discussion, in FIG. 12, the protection layer 60 is shown as being seen through, whereas in FIG. 13, the upper insulating layer 22 and the protection layer 60 are shown as being seen through.

In the semiconductor device A20, the structures of the base layer 12, the emitter layer 13, the insulating layer 20 (the lower insulating layer 21 and the upper insulating layer 22), the first electrode 31, the second electrode 32, the first wiring layer 34 and the protection component 50 is different from those described above in connection with the semiconductor device A10. The semiconductor device A20, as compared with the semiconductor device A10, further comprises a second wiring layer 35.

Figure 13:
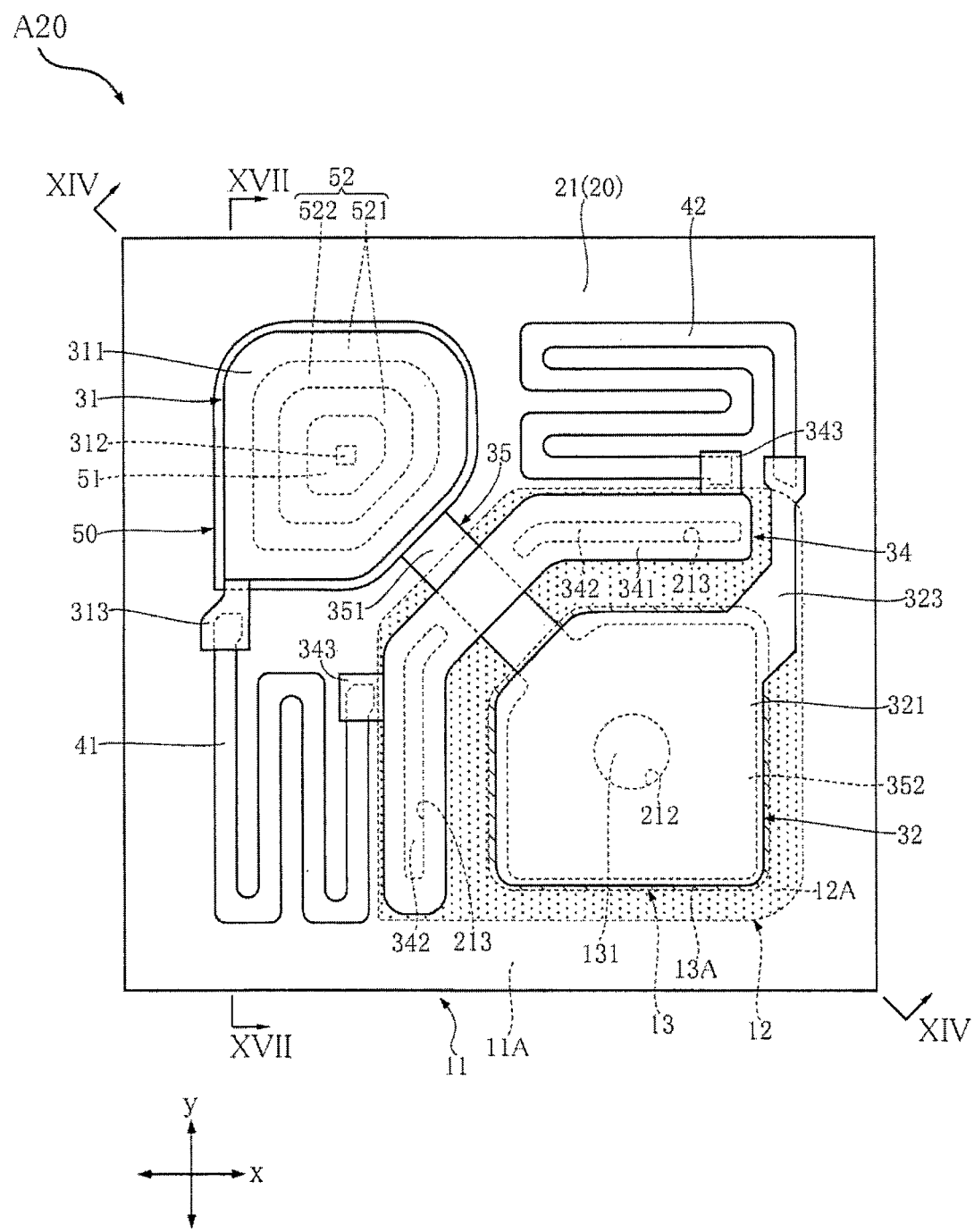
FIG. 13 is a top view of the semiconductor device shown in FIG. 12 (seeing through the upper insulating layer and protection layer).
Figure 15:
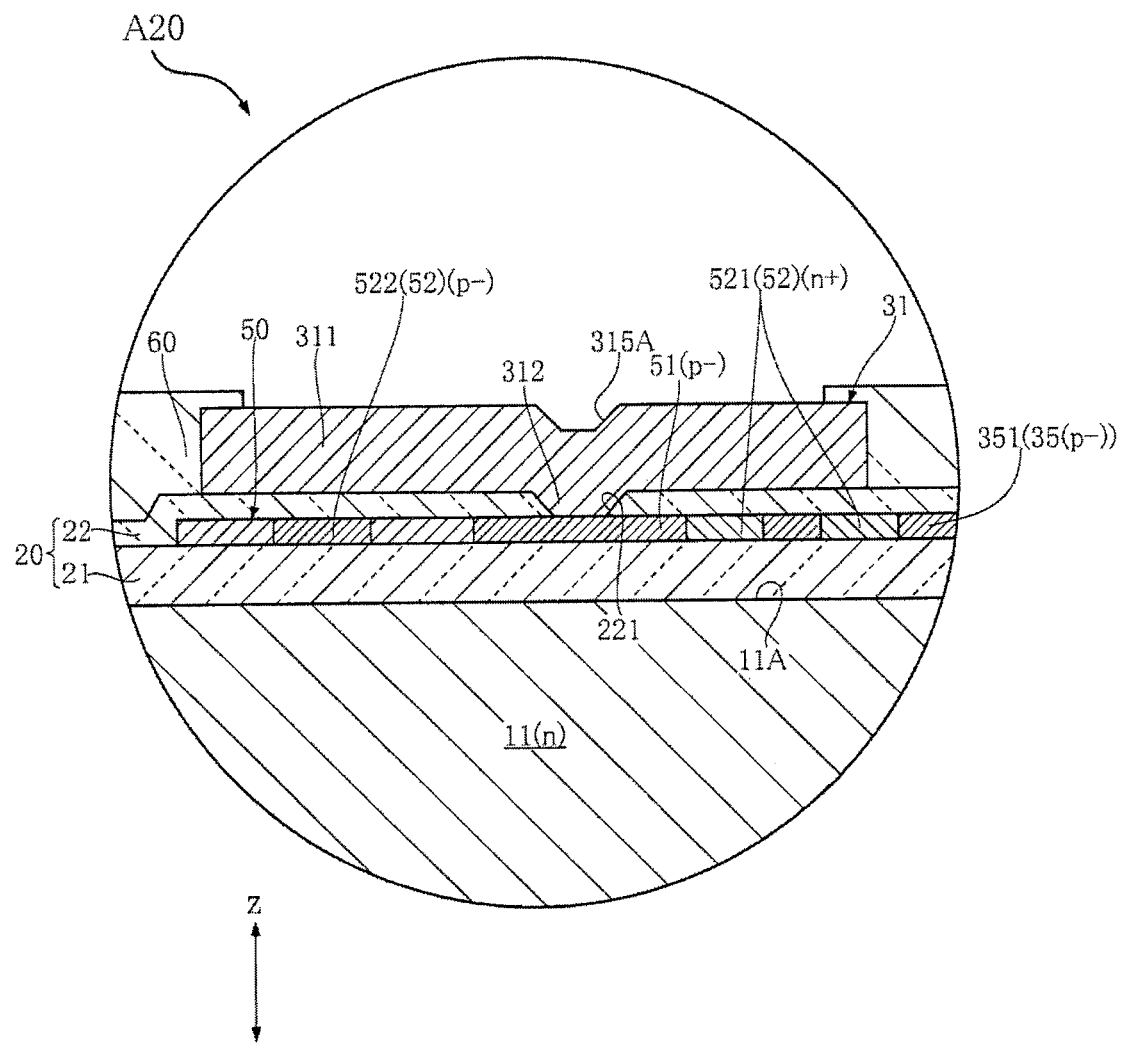
FIG. 15 is a partial enlargement view of FIG. 14.

As shown in FIG. 13, the area of the base primary face 12A of the base layer 12 is less than the area of the base primary face 12A of the semiconductor device A10. As shown in FIG. 15, the base layer 12 is not connected to the protection component 50.

Figure 16:
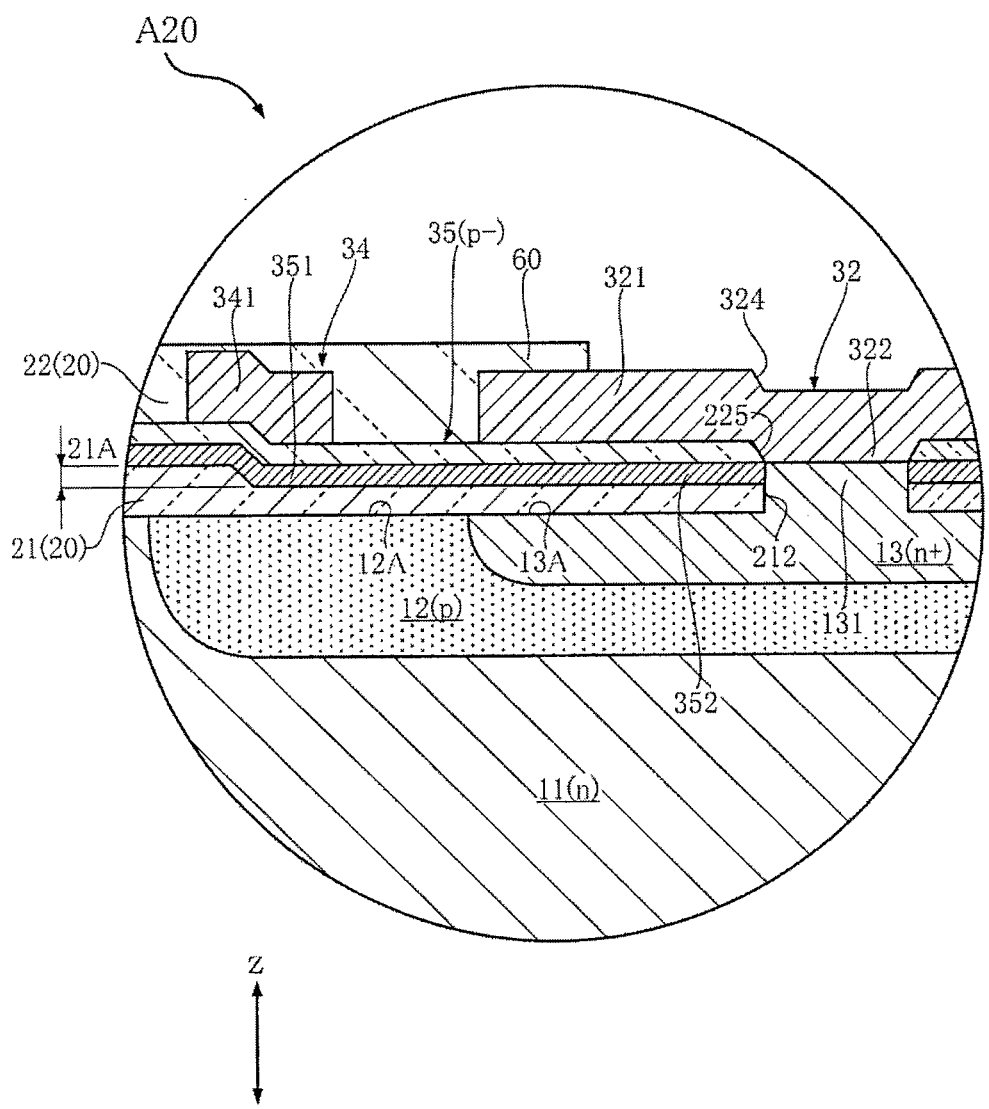
FIG. 16 is a partial enlargement view of FIG. 14.

As shown in FIG. 16, the emitter layer 13 comprises a bump 131 that protrudes from the emitter primary face 13A toward the thickness direction z.

As shown in FIG. 13 and FIG. 16, a second lower opening 212 and a pair of third lower openings 213 are formed at the lower insulating layer 21. The second lower opening 212, when viewed in the thickness direction z, overlaps with the second electrode 32, and leads to the emitter primary face 13A of the emitter layer 13. The bump 131 of the emitter layer 13 is disposed in the second lower opening 212. The pair of third lower openings 213, when viewed in the thickness direction z, overlap with the first wiring layer 34, and leads to the base primary face 12A. One of the third lower openings 213, when viewed in the thickness direction z, is disposed at one side of the extending direction of the first wiring layer 34 with respect to the second wiring layer 35. The other third lower opening 213, when being viewed in the thickness direction z, is disposed at the other side of the extending direction of the first wiring layer 34 with respect to the second wiring layer 35.

Figure 12:
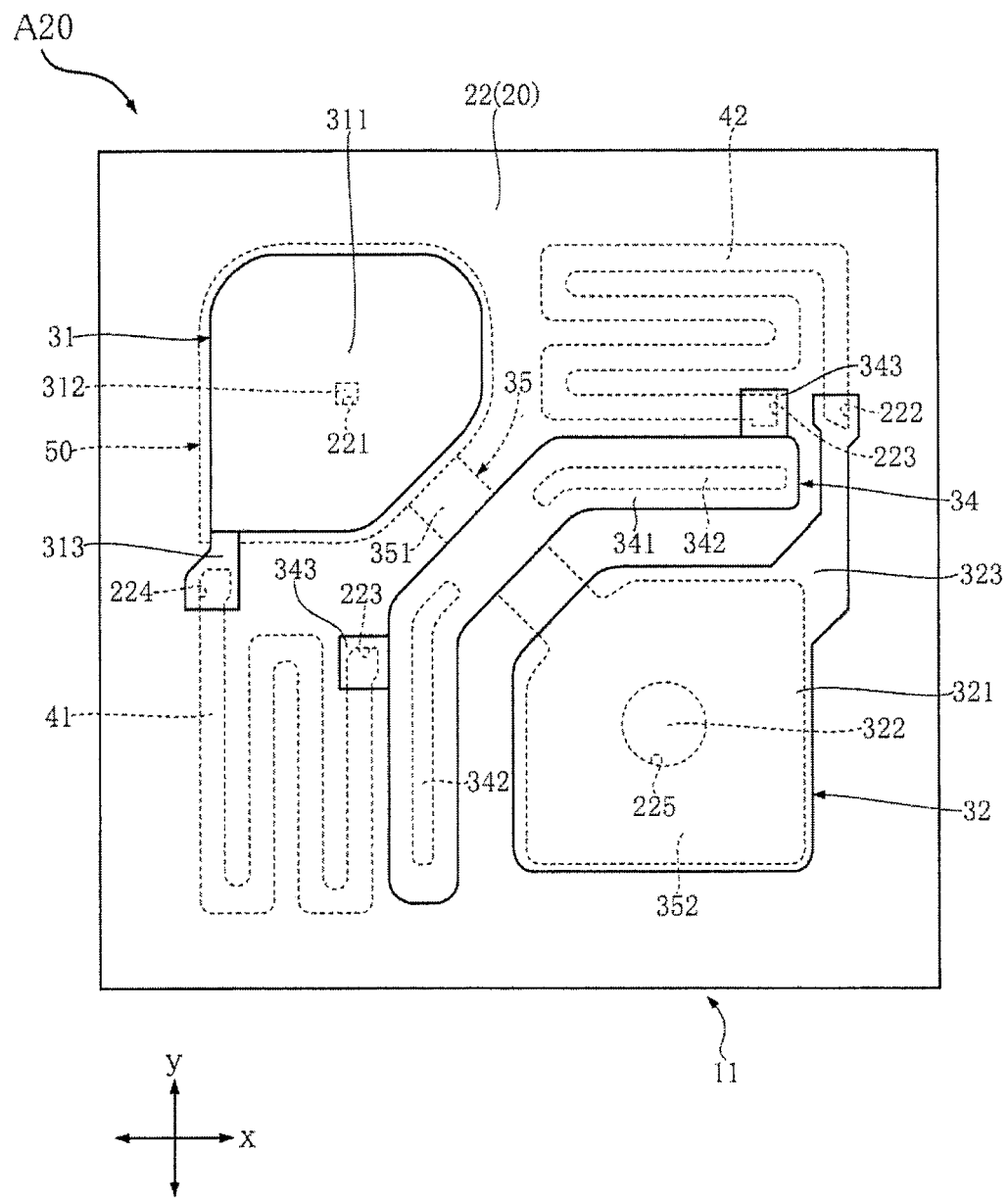
FIG. 12 is a top view of a semiconductor device according to the second embodiment of the present invention (seeing through the protection layer).
Figure 17:
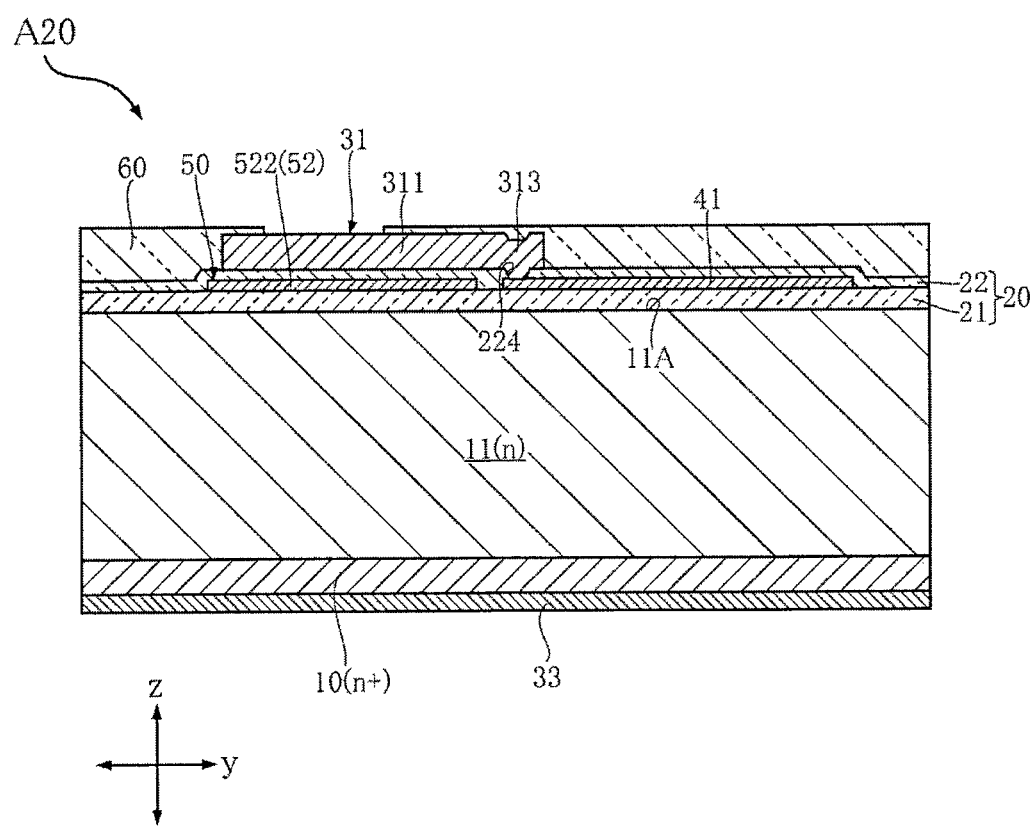
FIG. 17 is a cross sectional view taken along line XVII-XVII in FIG. 13.

As shown in FIG. 12, an first upper opening 221, an second upper opening 222, a pair of third upper openings 223, an upper fourth opening 224 and an upper fifth opening 225 are disposed at the upper insulating layer 22. Regarding the second upper opening 222 and the pair of third upper openings 223, their structures are the same as the structures of the second upper opening 222 and the pair of third upper openings 223 of the semiconductor device A10, and therefore, repetitive description thereof is omitted herein. The first upper opening 221, when viewed in the thickness direction z, overlaps with the center of the first electrode 31, and has a rectangular shape. Furthermore, the first upper opening 221, when viewed in the thickness direction z, may have, such as, a circular shape. The upper fourth opening 224, when viewed in the thickness direction z, overlaps with the first electrode 31. As shown in FIG. 17, the upper fourth opening 224 penetrates through the upper insulating layer 22 along the thickness direction z and leads to the first resistor component 41. The upper fifth opening 225, when viewed in the thickness direction z, overlaps with the second electrode 32. As shown in FIG. 16, the upper fifth opening 225 penetrates through the upper insulating layer 22 along the thickness direction z and leads to the bump 131 of the emitter layer 13.

As shown in FIG. 13, the first electrode 31, when viewed in the thickness direction z, does not overlap with the base layer 12. The first electrode 31 comprises a first terminal portion 311, a first conductive portion 312 and a first bonding pad portion 313. The structure of the first terminal portion 311 is the same as the structure of the first terminal portion 311 of the semiconductor device A10, and therefore, a repetitive description thereof is omitted herein.

Figure 14:
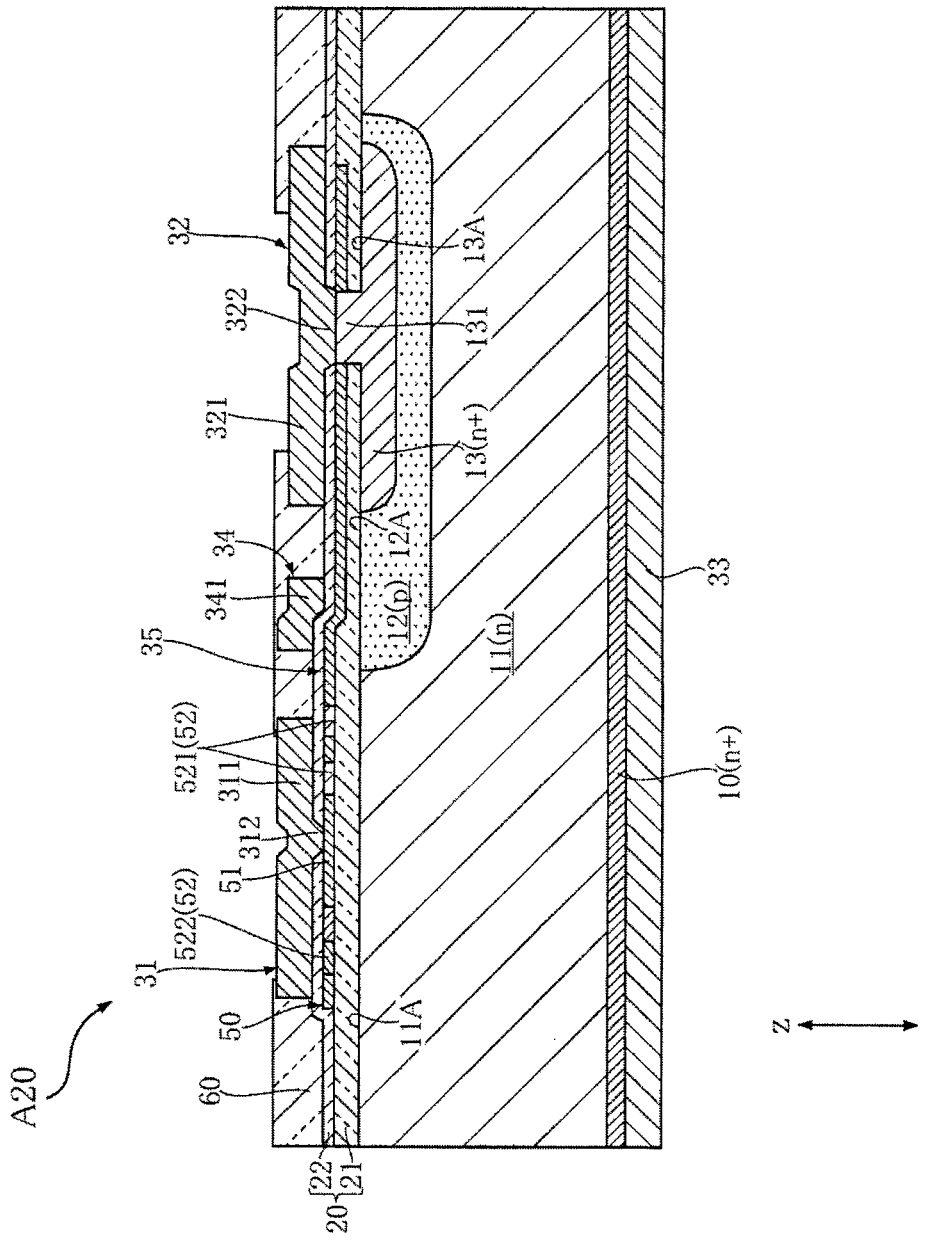
FIG. 14 is a cross sectional view taken along line XIV-XIV in FIG. 13.

As shown in FIG. 13 to FIG. 15, the first conductive portion 312 is disposed at the center of the first electrode 31 when viewed in the thickness direction z. The first conductive portion 312 is disposed in the first upper opening 221. In this way, the first conductive portion 312 has a rectangular shape when viewed in the thickness direction z.

As shown in FIG. 12 and FIG. 13, the first bonding pad portion 313 extends from the corner of the first terminal portion 311 toward the second direction y. As shown in FIG. 17, a portion of the front end of the first bonding pad portion 313 is disposed in the upper fourth opening 224 of the upper insulating layer 22 and is connected with the first resistor component 41. In this way, the first electrode 31 is electrically connected to the first resistor component 41.

As shown in FIG. 15, the first electrode 31 does not include the bump 314 and the second recess 315B, and instead includes only a first recess 315A. The first recess 315A, when viewed in the thickness direction z, is disposed at the center of the first electrode 31 and has a rectangular shape. The position of the first recess 315A corresponds to the position of the first conductive portion 312, when viewed in the thickness direction z.

As shown in FIG. 16, the second conductive portion 322 of the second electrode 32 is connected with the bump 131 of the emitter layer 13. The second conductive portion 322 is disposed in the upper fifth opening 225 of the upper insulating layer 22.

As shown in FIG. 12 and FIG. 13, the first wiring layer 34 comprises a main body 341, a pair of third conductive portions 342 and a pair of third bonding pad portions 343. The structures of the main body 341 and the pair of third bonding pad portions 343 are the same as the structures of the main body 341 and the pair of third bonding pad portions 343 of the semiconductor device A10, and therefore, a repetitive description thereof is omitted herein.

Like the semiconductor device A10 shown in FIG. 10, the pair of third conductive portions 342 are disposed in the pair of third lower openings 213 of the lower insulating layer 21. The pair of third conductive portions 342 are connected with the base primary face 12A of the base layer 12. A pair of recesses 344 is formed at the first wiring layer 34. The position of the pair of recesses 344 corresponds to the position of the pair of third conductive portions 342, when viewed in the thickness direction z.

Figure 18:
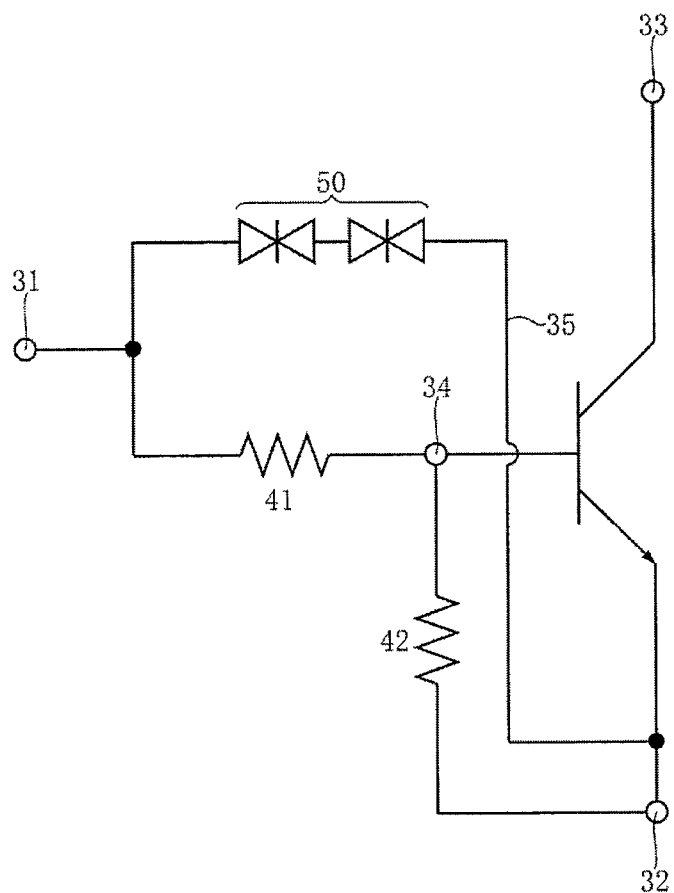
FIG. 18 is a circuit diagram of the semiconductor device shown in FIG. 12.

As shown in FIG. 18, the second wiring layer 35 is a conductive component that electrically connects to the protection component 50 and the second electrode 32. The second wiring layer 35 is made from the material comprising the polycrystalline silicon. The second wiring layer 35 is formed by the following operations: doping the p-type dopant into the polycrystalline silicon via ion implantation. Therefore, the second wiring layer 35 is the second conductivity type semiconductor. The concentration of the p-type dopant in the second wiring layer 35 is less than the concentration of the p-type dopant in the base layer 12. Therefore, in the cross sectional view, the second conductivity type semiconductor of the second wiring layer 35 is labeled as "p−". As shown in FIG. 12, FIG. 13 and FIG. 16, the second wiring layer 35 comprises a band 351 and an emitter connection portion 352.

As shown in FIG. 12 and FIG. 13, the band 351, when viewed in the thickness direction z, extends from the outer periphery of the protection component 50 toward the second electrode 32. One end of the band 351 is connected with the outer periphery of the protection component 50. The other end of the band 351 is connected with the emitter connection portion 352. In this way, the second wiring layer 35 is electrically connected to the protection component 50. The band 351, when viewed in the thickness direction z, intersects with the first wiring layer 34. As shown in FIG. 16, the band 351 is disposed on the lower insulating layer 21 and is covered by the upper insulating layer 22. In this way, the band 351 is covered by the insulating layer 20. A portion of the main body 341 of the first wiring layer 34 that intersects with the band 351, when viewed in the thickness direction z, is disposed on the upper insulating layer 22.

As shown in FIG. 12, FIG. 13 and FIG. 16, the emitter connection portion 352, when being viewed in the thickness direction z, surrounds the bump 131 of the emitter layer 13. In the thickness direction z, the emitter connection portion 352 is disposed between the emitter primary face 13A of the emitter layer 13 and the second terminal portion 321 of the second electrode 32. The emitter connection portion 352 is connected to the bump 131. In this way, the second wiring layer 35 is electrically connected to the emitter layer 13 and the second electrode 32.

As shown in FIG. 14 and FIG. 15, in the thickness direction z, the protection component 50 is disposed between the collector layer 11 and the first electrode 31. The contact 51 of the protection component 50 is connected with the first conductive portion 312 of the first electrode 31. In this way, the protection component 50 is electrically conducted with the first electrode 31. When viewed in the thickness direction z, the outermost ring 52 of the protection component 50 is a first ring 521. The first ring portion 521 is connected with the band 351 of the second wiring layer 35.

As shown in FIG. 18, in the semiconductor device A20, the protection component 50 comprises two or more sets of paired diodes formed by pn junction in which the two ends of its conductive path are made into a same polarity (anode). The band 351 of the second wiring layer 35 connected to the protection component 50, together with the first ring 521 of the ring 52 connected thereto and the second ring portion 522 of the ring 52 connected to the aforesaid first ring 521, constitutes a pair of diodes. Therefore, the second wiring layer 35 also comprises a portion of the protection component 50. These pairs of diodes are connected in series in the conductive path of the first electrode 31 and the second electrode 32.

The First Variant of the Second Embodiment

Next, the semiconductor device A21 according to the first variant of the semiconductor device A20 is discussed with reference to FIG. 19.

In the semiconductor device A21, the structures of the emitter layer 13, the second electrode 32 and the second wiring layer 35 are different from those described above in connection with the semiconductor device A20.

Figure 19:
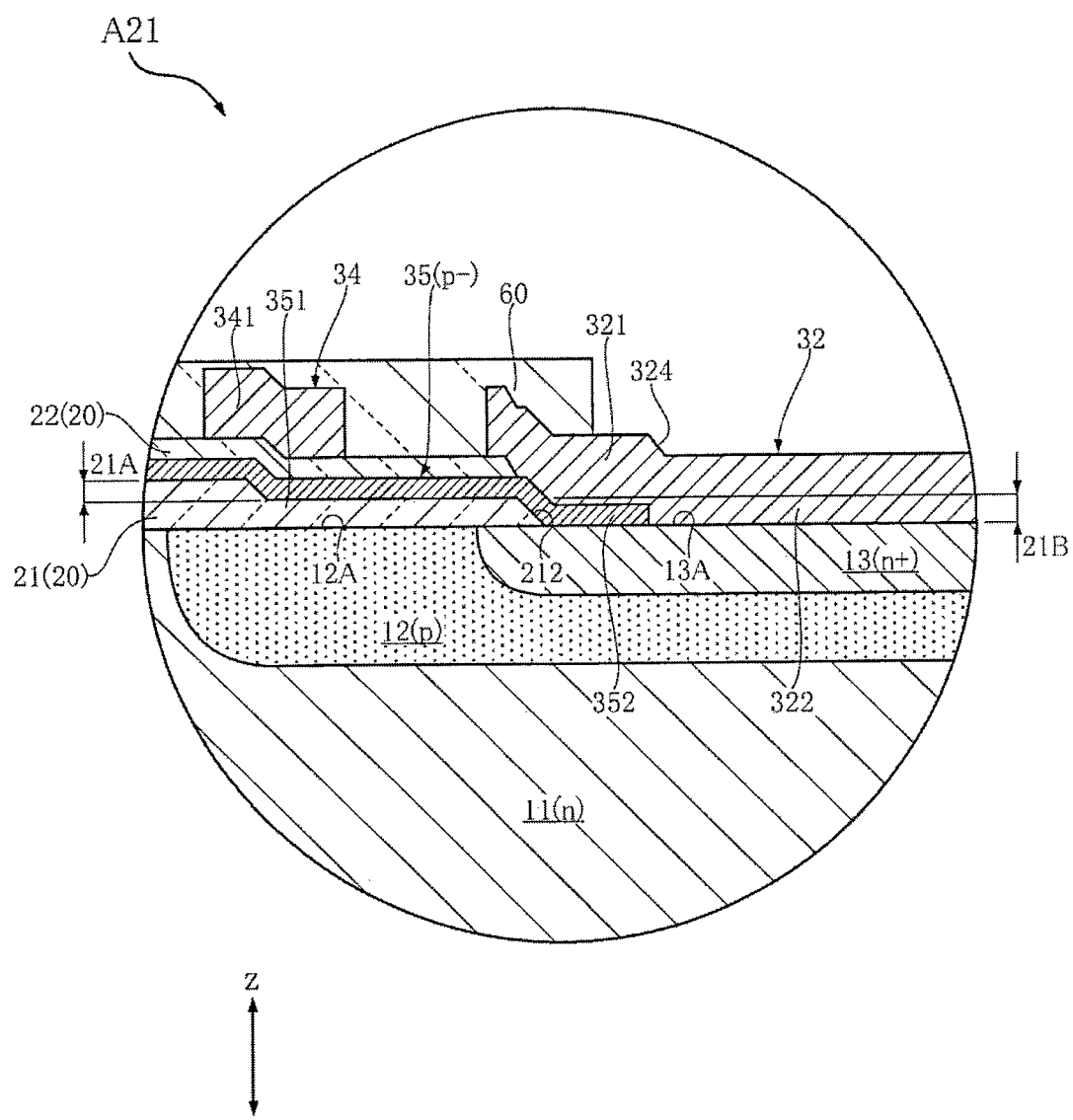
FIG. 19 is a partial enlargement sectional view of a semiconductor device according to the first variant of the second embodiment of the present invention.

As shown in FIG. 19, the structure of the emitter layer 13 does not include the bump 131. The second conductive portion 322 of the second electrode 32 and a portion of the emitter connection portion 352 of the second wiring layer 35 are disposed in the second lower opening 212 of the lower insulating layer 21. The second conductive portion 322 is connected with the emitter primary face 13A of the emitter layer 13. The emitter connection portion 352 is connected with the emitter primary face 13A and the second conductive portion 322. The emitter connection portion 352, when viewed in the thickness direction z, is connected with a portion of the periphery of the second conductive portion 322.

The Second Variant of the Second Embodiment

Next, the semiconductor device A22 according to the second variant of the semiconductor device A20 is discussed with reference to FIG. 20 and FIG. 21.

In the semiconductor device A22, the structure of the protection component 50 is different from with the aforementioned semiconductor device A20 as discussed.

Figure 20:
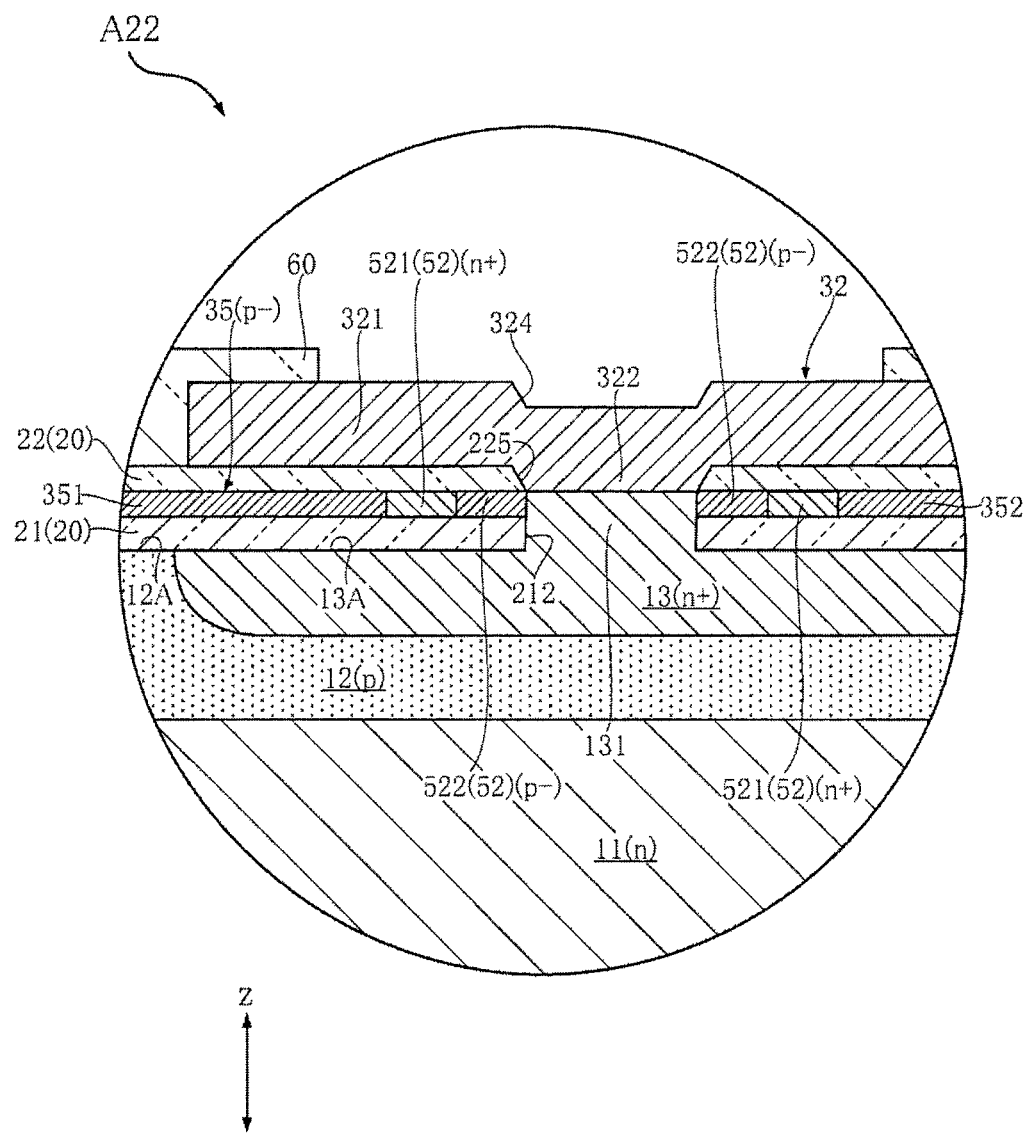
FIG. 20 is a partial enlargement sectional view of a semiconductor device according to the second variant of the second embodiment of the present invention.

As shown in FIG. 20, a portion of the plurality of rings 52 constituting the protection component 50 is disposed between the emitter layer 13 and the second electrode 32 in the thickness direction z, and is disposed between the bump 131 of the emitter layer 13 and the emitter connection portion 352 of the second wiring layer 35, when viewed in the thickness direction z. Each of the plurality of rings 52, when viewed in the thickness direction z, surrounds the bump 131. The second ring 522 of the ring portion 52 is connected with the bump 131. The first ring 521 of the ring portion 52 is connected with the second ring 522. The emitter connection portion 352 is connected with the first ring 521. Pairs of diodes are formed by pn junction of the plurality of rings 52 and emitter connection portion 352. These pairs of diodes respectively have the same polarity at two ends of its conductive path. The polarity is anodic.

Figure 21:
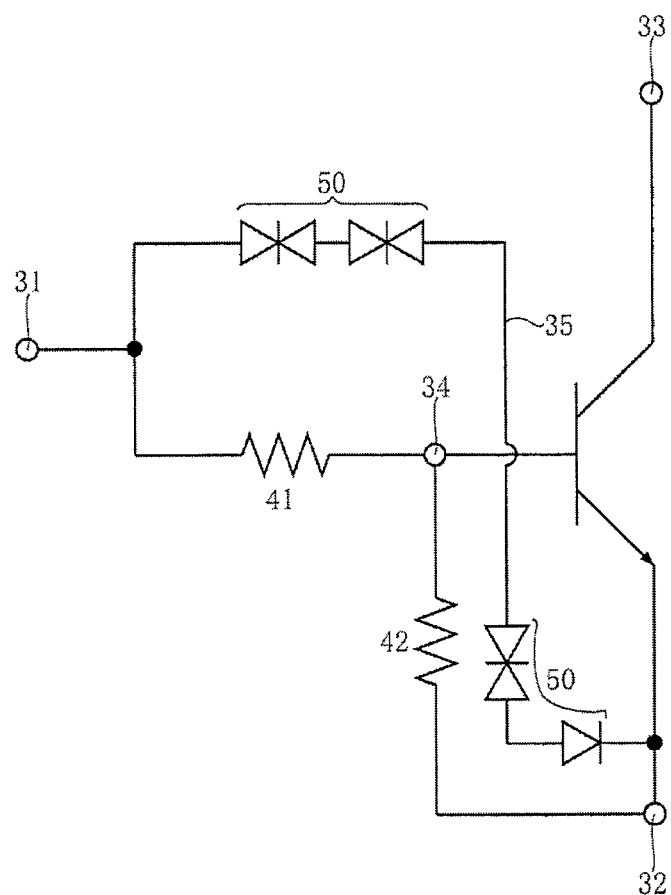
FIG. 21 is a circuit diagram of the semiconductor device shown in FIG. 20.
Figure 22:
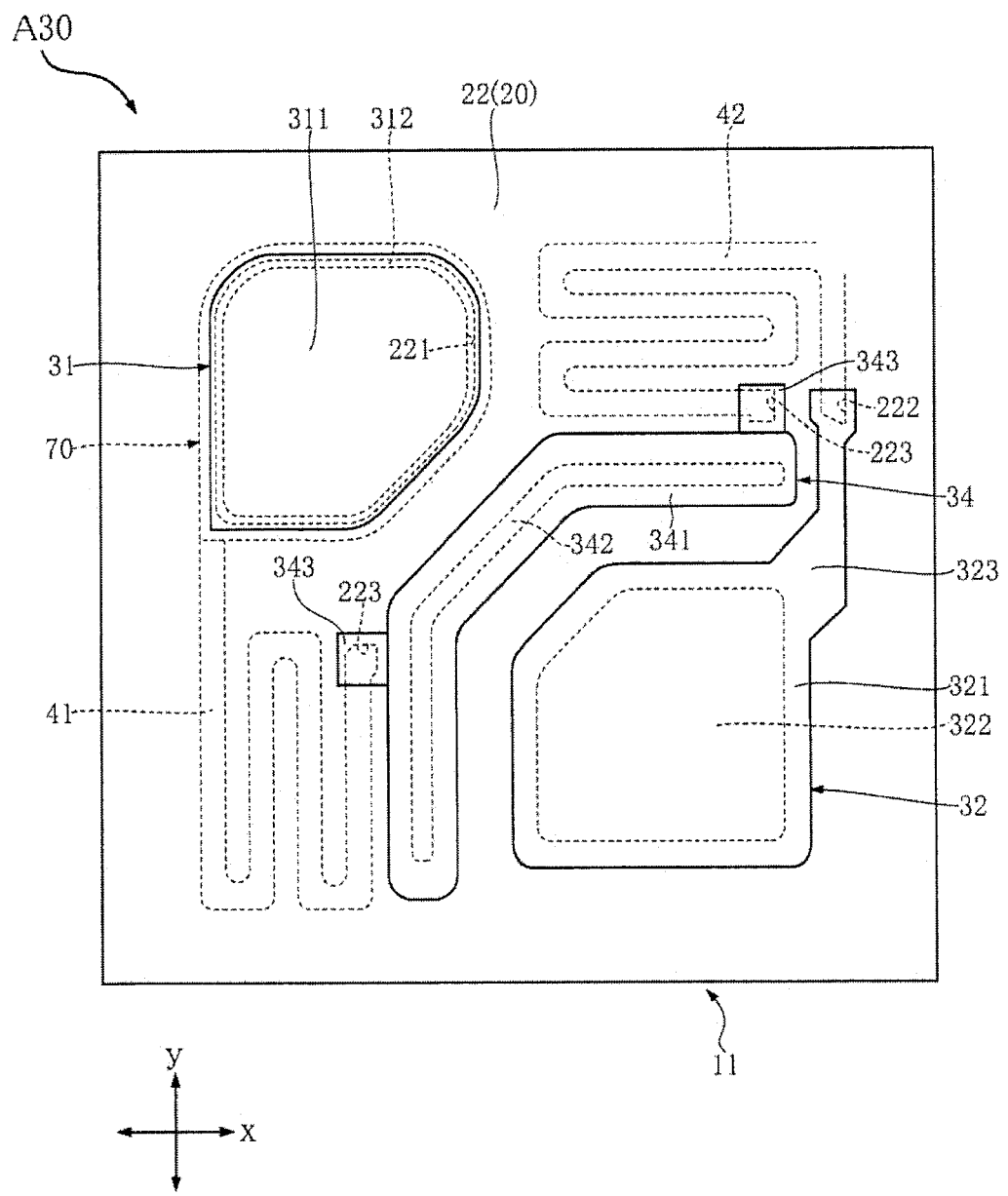
FIG. 22 is a top view of a semiconductor device according to the third embodiment of the present invention (seeing through the protection layer).

As shown in FIG. 21, in the semiconductor device A22, the protection component 50 comprises three pairs of diodes formed by pn junction in which the two ends in its conductive path are made into the same polarity (anodic). In the second wiring layer 35, other than the band 351, the emitter connection portion 352 also comprises a portion of the protection component 50. These pairs of diodes are connected in series in the conductive path of the first electrode 31 and the second electrode 32. Furthermore, a diode is in series connection with these pairs of diodes, wherein said diode is formed by pn junction of the bump 131 of the emitter layer 13 and the second ring 522 of the ring 52 connected with the bump 131.

Next, the effects of the semiconductor device A20 are discussed.

The structure of the semiconductor device A20, as shown in FIG. 18, comprises a protection component 50 connected in series with first electrode 31 with respect to the first resistor component 41. The protection component 50 comprises a pair of diodes formed by pn junction, wherein the two ends of its conductive path are made to have the same polarity. Therefore, the present semiconductor device A20 can also protect the first resistor component 41 connected to the first electrode 31 from being damaged by electrostatic.

The semiconductor device A20 comprises a second wiring layer 35 that electrically connects the protection component 50 to the second electrode 32. The second wiring layer 35 is connected with the second electrode 32. In this way, the static electricity applied to the first electrode 31 may arrive at the second electrode 32 via the protection component 50 and the second wiring layer 35. Therefore, the static electricity applied to the first electrode 31 will not flow to the collector layer 11, the base layer 12 and emitter layer 13 that form the bipolar transistor in the semiconductor device A20, and hence, it is feasible to acquire the protection effect of these semiconductor layers from the static electricity.

The protection component 50 comprises a contact 51 and a plurality of rings 52. They are formed by the semiconductor that is of the same conductivity type as the semiconductor device A10. Therefore, the present semiconductor device A20 can also increase the number of the pairs of diodes included in the protection component 50. Thus, it is feasible to increase the tolerance capacity of the first resistor component 41 with regard to the electrostatic damage.

In the semiconductor device A22, a plurality of rings 52 constituting a portion of the protection component 50 is disposed between the emitter layer 13 and the second electrode 32 in the thickness direction z, and is disposed between the bump 131 of the emitter layer 13 and the emitter connection portion 352 of the second wiring layer 35, when being viewed in the thickness direction z. In this way, it may further increase its tolerance capacity with regard to the electrostatic damage of the first resistor component 41, compared with that of the semiconductor device A20.

The Third Embodiment

The semiconductor device A30 according to the third embodiment of the present invention is discussed with reference to FIG. 22 to FIG. 28. In these drawings, elements the same as or similar to those described above in connection with semiconductor device A10 are given the same reference numerals, and repetitive description is omitted. Furthermore, to facilitate the discussion, in FIG. 22, the protection layer 60 is shown as being seen through, whereas in FIG. 23, the upper insulating layer 22 and the protection layer 60 are shown as being seen through. In FIG. 24, the first electrode 31 is shown as being seen through. The see-through first electrode 31 in FIG. 24 is illustrated with a hypothetical line.

In the semiconductor device A30, the structures of the base layer 12, the first resistor component 41 and the protection component 50 are different from the aforementioned semiconductor device A10 previously discussed. The semiconductor device A30, compared with the semiconductor device A10, further comprises an auxiliary protection component 70.

Figure 23:
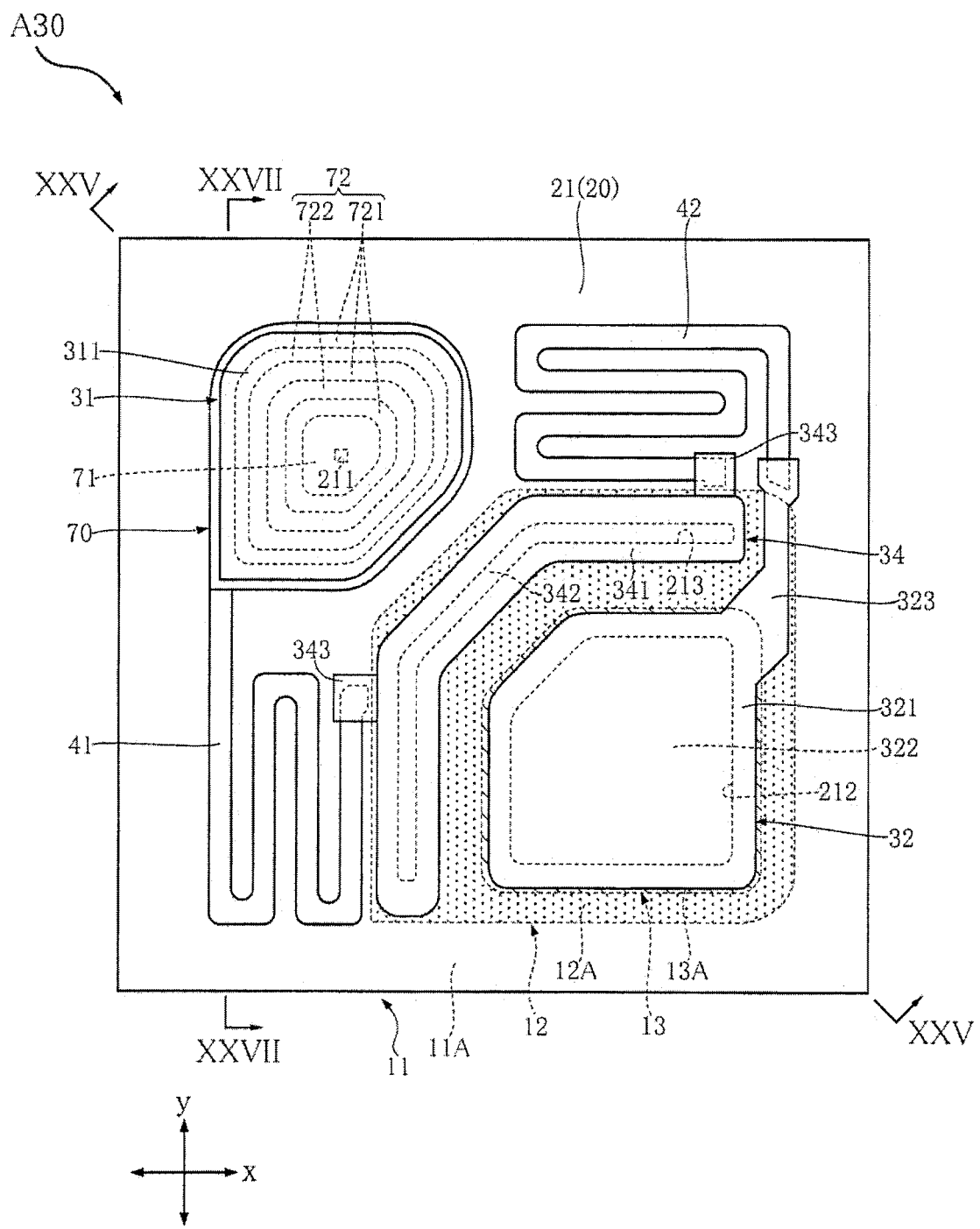
FIG. 23 is a top view of the semiconductor device shown in FIG. 22 (seeing through the upper insulating layer and protection layer).
Figure 24:
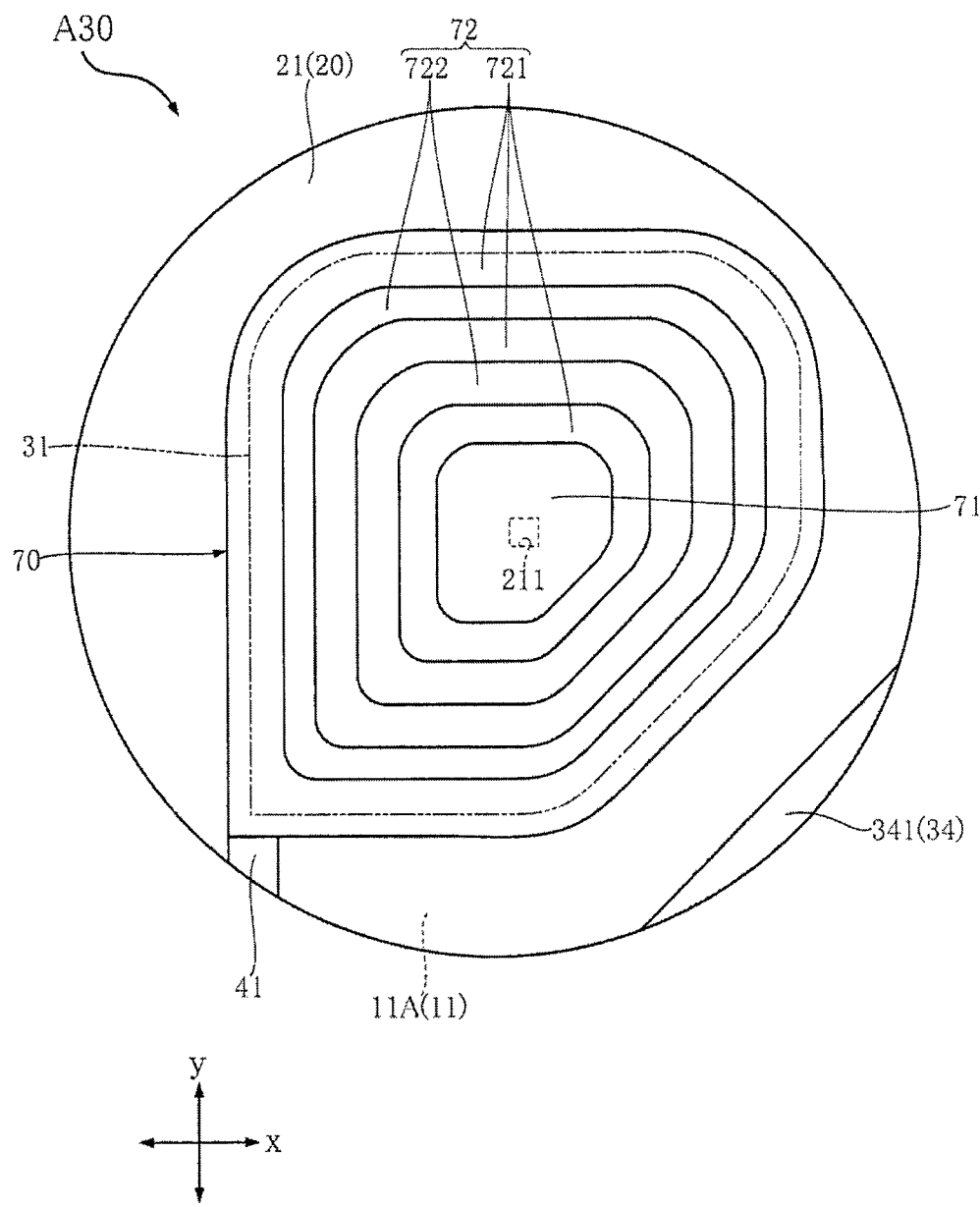
FIG. 24 is a partial enlargement view of FIG. 23 (seeing through the first electrode).
Figure 25:
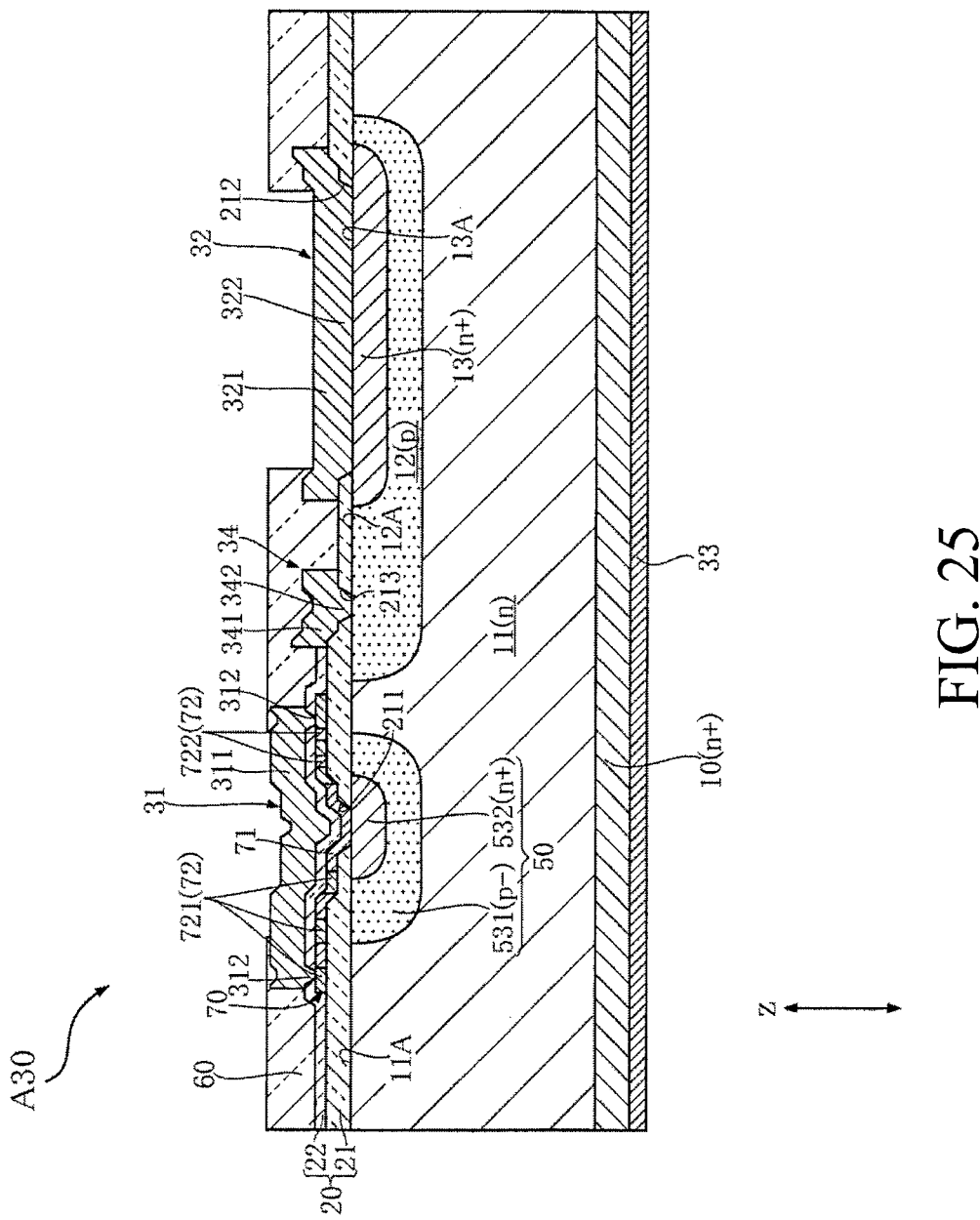
FIG. 25 is a cross sectional view taken along line XXV-XXV in FIG. 23.

As shown in FIG. 23, the area of the base primary face 12A of the base layer 12 is less than the area of the base primary face 12A of the semiconductor device A10. As shown in FIG. 25, the base layer 12 is not connected with the protection component 50.

Figure 27:
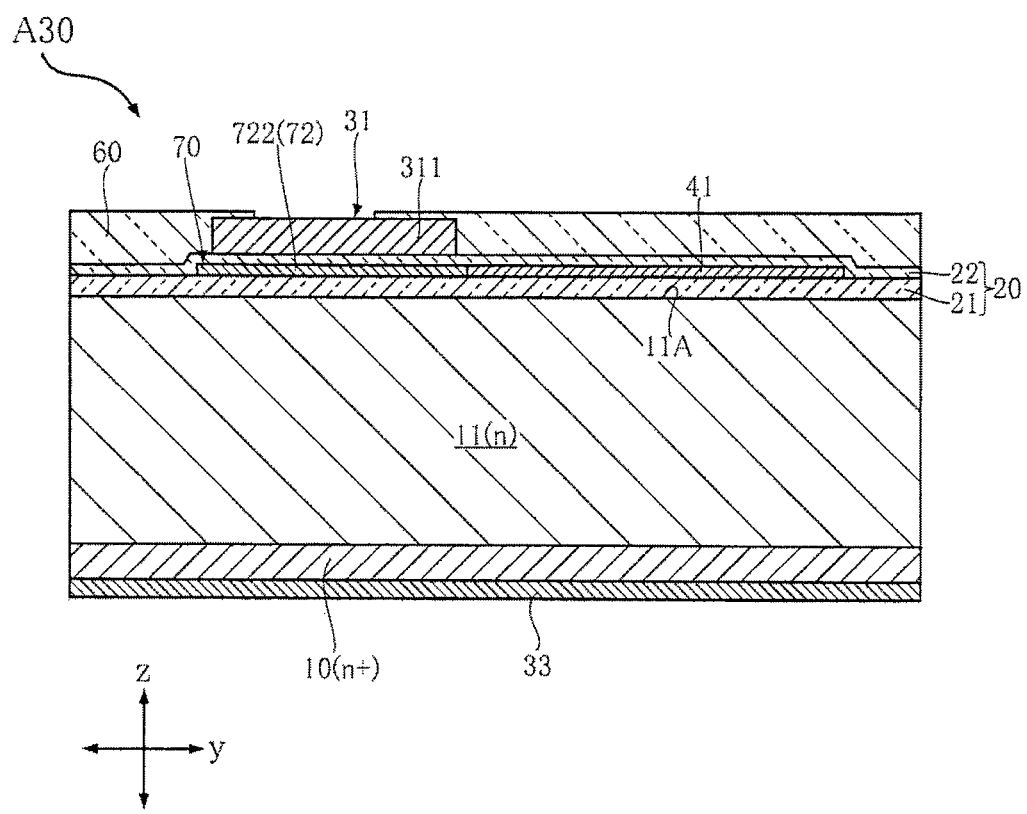
FIG. 27 is a cross sectional view taken along line XXVII-XXVII in FIG. 23.

As shown in FIG. 23 and FIG. 27, the first resistor component 41, when viewed in the thickness direction z, is connected with the periphery of the auxiliary protection component 70.

Figure 26:
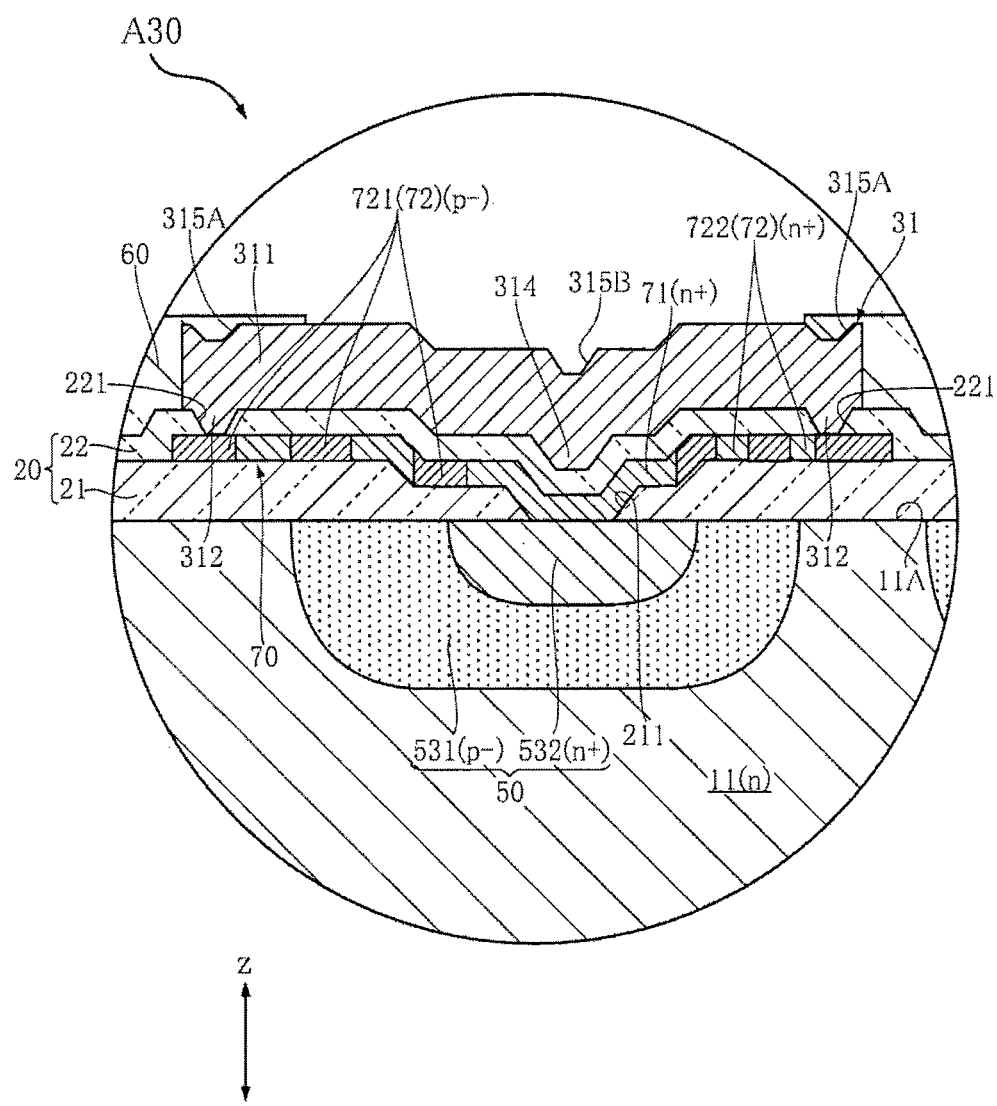
FIG. 26 is a partial enlargement view of FIG. 25.

As shown in FIG. 25 and FIG. 26, the protection component 50 is connected with the collector layer 11. The protection component 50 comprises a first diffusion layer 531 and a second diffusion layer 532. The first diffusion layer 531 is connected with the collector layer 11. The first diffusion layer 531, similar to the base layer 12, is formed by the following operations: doping the p-type dopant into a portion of the collector layer 11 via ion implantation. Therefore, the first diffusion layer 531 is a layer obtained by converting a portion of the collector layer 11 with the second conductivity type semiconductor. The concentration of the p-type dopant in the first diffusion layer 531 is less than the concentration of the p-type dopant in the base layer 12. The first diffusion layer 531 is separated from the base layer 12.

The second diffusion layer 532 is connected to the first diffusion layer 531. The second diffusion layer 532, similar to the emitter layer 13, is formed by the following operations: doping the n-type dopant into a portion of the first diffusion layer 531 via ion implantation. Therefore, the second diffusion layer 532 is a layer obtained by converting a portion of the first diffusion layer 531 with the first conductivity type semiconductor. The concentration of the n-type dopant in the second diffusion layer 532 is greater than the concentration of the n-type dopant in the collector layer 11. Therefore, in the cross sectional view, semiconductor of the first conductivity type forming the first diffusion layer 531 is labeled as "p−", whereas the semiconductor of the second conductivity type forming the second diffusion layer 532 is labeled as "n+".

As shown in FIG. 26, the surfaces of the first diffusion layer 531 and the second diffusion layer 532 facing one side in the thickness direction z are coplanar with the collector primary face 11A of the collector layer 11. These surfaces, together with the collector primary face 11A, are covered by the lower insulating layer 21. The first lower opening 211 disposed at the lower insulating layer 21 leads to the surface of the second diffusion layer 532 facing one side in the thickness direction z.

As shown in FIG. 26, in the thickness direction z, a pair of diodes are formed by the pn junction of the second diffusion layer 532, first diffusion layer 531 connected with the second diffusion layer 532, and collector layer 11 connected with the first diffusion layer 531. The two ends of the conductive path of the pair of diodes have the same polarity. The polarity is cathodic. In the semiconductor device A30, the structure of the protection component 50 comprises the pair of diodes. Therefore, the collector layer 11 comprises a portion of the protection component 50.

Figure 28:
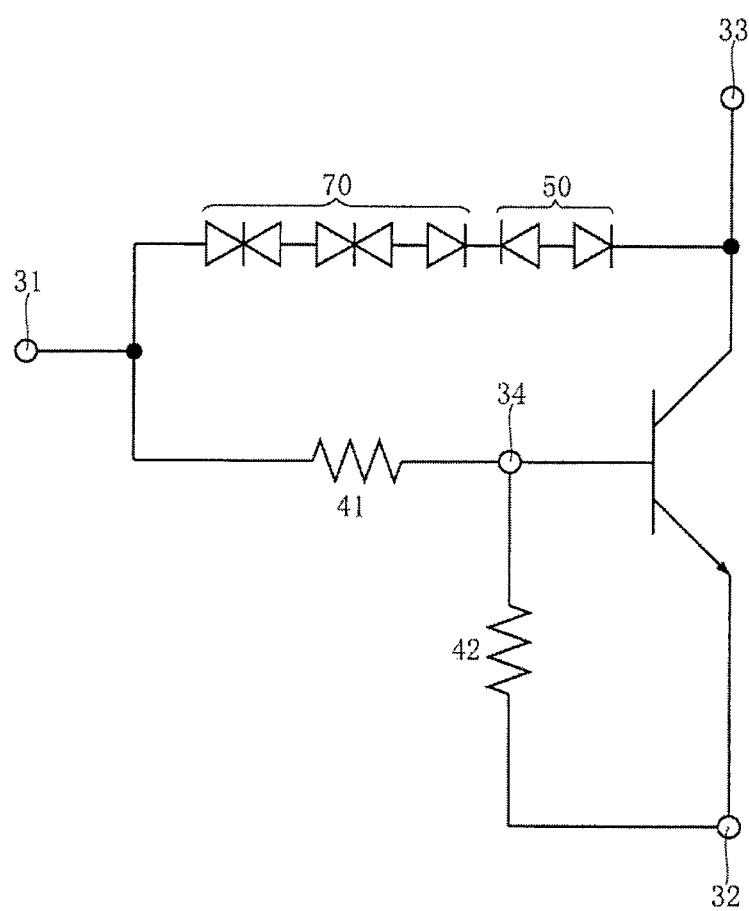
FIG. 28 is a circuit diagram of the semiconductor device shown in FIG. 22.

As shown in FIG. 28, the auxiliary protection component 70 is connected to the first electrode 31 and is in parallel with the first resistor component 41. As shown in FIG. 24 and FIG. 26, in the thickness direction z, the auxiliary protection component 70 is disposed between the protection component 50 and the first electrode 31. The auxiliary protection component 70 is connected with both the protection component 50 and the first electrode 31. In this way, the auxiliary protection component 70 is electrically connected to the protection component 50 and the first electrode 31. Therefore, protection component 50 is formed as being connected in series with auxiliary protection component 70. The auxiliary protection component 70 is disposed on the lower insulating layer 21 and is covered by the upper insulating layer 22. In this way, the auxiliary protection component 70 is covered by the insulating layer 20. The auxiliary protection component 70 is formed by the material comprising the polycrystalline silicon. The auxiliary protection component 70 is the polycrystalline silicon doped with the p-type dopant and n-type dopant. The auxiliary protection component 70 comprises an auxiliary contact 71 and an auxiliary ring 72.

As shown in FIG. 24 and FIG. 26, the auxiliary contact portion 71, when viewed in the thickness direction z, is disposed at the center of the auxiliary protection component 70. A portion of the auxiliary contact 71 is disposed in the first lower opening 211 of the lower insulating layer 21. A portion of the auxiliary contact 71 that is disposed in the first lower opening 211 is connected to the second diffusion layer 532 of the protection component 50. The auxiliary contact 71 is formed by the following operations: doping the p-type dopant and n-type dopant into the polycrystalline silicon via ion implantation. In the auxiliary contact 71, the concentration of the n-type dopant is greater than the concentration of the p-type dopant. Therefore, the auxiliary contact 71 is a first conductivity type semiconductor. Moreover, the concentration of the n-type dopant in the auxiliary contact 71 is greater than the concentration of the n-type dopant in the collector layer 11. Therefore, in the cross sectional view, the first conductivity type semiconductor of the auxiliary contact 71 is labeled as "n+".

As shown in FIG. 24 and FIG. 26, the plurality of auxiliary rings 72, when viewed in the thickness direction z, surrounds the auxiliary contact 71, respectively. The plurality of auxiliary rings 72 comprise a plurality of first auxiliary rings 721 and a plurality of second auxiliary rings 722. The plurality of first auxiliary rings 721 are formed by the following operations: doping the p-type dopant into the polycrystalline silicon via ion implantation. Therefore, the plurality of first auxiliary rings 721 are the second conductivity type semiconductor. The concentration of the p-type dopant in the plurality of first auxiliary rings 721 is less than the concentration of the p-type dopant in the base layer 12. The plurality of second auxiliary rings 722 are formed by the following operations: doping the p-type dopant into the polycrystalline silicon via ion implantation. In the plurality of second auxiliary rings 722, the concentration of the n-type dopant is greater than the concentration of the p-type dopant. Therefore, the plurality of second auxiliary rings 722 are the first conductivity type semiconductor. Moreover, the concentration of the n-type dopant in the plurality of second auxiliary rings 722 is greater than the concentration of the n-type dopant in the collector layer 11. Therefore, in the cross sectional view, the second conductivity type semiconductor of the plurality of first auxiliary rings 721 is labeled as "p−", and the first conductivity type semiconductor of the plurality of second auxiliary rings 722 is labeled as "n+".

As shown in FIG. 24 and FIG. 26, the plurality of auxiliary rings 72, when viewed in the thickness direction z, comprise each of the plurality of first auxiliary rings 721 and each of the plurality of second auxiliary rings 722 alternately disposed. The adjacent first auxiliary ring 721 and the second auxiliary ring 722 are connected with each other. The innermost one of the auxiliary ring 72 is a first auxiliary ring 721, when viewed in the thickness direction z. The first auxiliary ring 721 is connected with the auxiliary ring 72. The outermost one of the auxiliary ring 72 is a first auxiliary ring portion 721, when viewed in the thickness direction z. The first auxiliary ring 721 is connected with the first conductive portion 312 of the first electrode 31 and the first resistor component 41. In this way, the first resistor component 41 is electrically connected to the first electrode 31 via the first auxiliary ring 721. Therefore, the second electrode 32 is electrically connected to the first electrode 31 via the second resistor component 42, the first wiring layer 34, the first resistor component 41 and the first auxiliary ring 721.

As shown in FIG. 26, in the auxiliary protection component 70, a pair of diodes are formed by pn junction of the outermost first auxiliary ring 721, and the second auxiliary ring 722 adjacent to the inner periphery of such first auxiliary ring portion 721, and another DD first auxiliary ring portion 721 adjacent to the inner periphery of the second auxiliary ring portion 722, when viewed in the thickness direction z. Moreover, in the auxiliary protection component 70, a pair of diodes are formed by pn junction of the first auxiliary ring 721 connected with the auxiliary contact 71, the second auxiliary ring 722 adjacent to the outer periphery of the first auxiliary ring 721, and another first auxiliary ring 721 adjacent to the outer periphery of the second auxiliary ring portion 722, when viewed in the thickness direction z. The two ends of the conductive path of each of these pairs of diodes are of the same polarity. The polarity is anodic. Therefore, the auxiliary protection component 70 comprises two sets of paired diodes formed by pn junction in which the two ends in its conductive path are made to have the same polarity. These pairs of diodes are connected in series. Hence, in the auxiliary protection component 70, the diode is formed by pn junction of the auxiliary contact 71 and the first auxiliary ring 721 connected with the auxiliary contact 71. The polarity of the side of the first electrode 31 of the diode is anodic. Therefore, there is no barrier formed via pn junction at the interface between the auxiliary protection component 70 and the protection component 50.

Next, the effects of the semiconductor device A30 are discussed.

The structure of the semiconductor device A30, as shown in FIG. 28, comprises the protection component 50 that is connected in series with first electrode 31 with respect to the first resistor component 41. The protection component 50 comprises a pair of diodes formed by pn junction in which the two ends of its conductive path are made to have the same polarity. Therefore, the present semiconductor device MO can also protect the first resistor component 41 connected to the first electrode 31 from being damaged by the electrostatic.

The semiconductor device A20 comprises the auxiliary protection component 70 connected to the protection component 50 and the first electrode 31. In this way, it is feasible to direct the static electricity applied to the first electrode 31 to the second electrode 32 via the auxiliary protection component 70, protection component 50, the collector layer 11, the base layer 12 and the emitter layer 13.

The auxiliary protection component 70 comprises the auxiliary contact 71 and a plurality of auxiliary rings 72. The auxiliary contact portion 71 is a first conductivity type semiconductor and is connected with the protection component 50. The plurality of auxiliary rings 72, when viewed in the thickness direction z, surrounds the auxiliary contact 71, respectively. The plurality of auxiliary rings 72 comprises each of the plurality of first auxiliary rings 721 of the second conductivity type semiconductor and each of the plurality of second auxiliary rings 722 of the first conductivity type semiconductor alternately disposed. In this way, with the auxiliary protection component 70, the number of the pair of diodes can be increased. Therefore, the tolerance capacity with regard to the electrostatic damage of the first resistor component 41 can be increased.

In the semiconductor device A30, the withstand voltage acquired from the pair of diodes included by the protection component 50 is about 10 V. Therefore, when the driving voltage (the voltage applied to the first electrode 31) is lower than the withstand voltage acquired from the pair of diodes, the structure of the semiconductor device A30 the auxiliary protection component 70 may be omitted.

The present invention is not limited to the embodiments described above. The specific structure of each component or part of the present invention may be changed freely.

The present invention has been discussed with a certain degree of particularity based on embodiments thereof; however, these embodiments only disclose the principles of the present invention, and the applications of these embodiments allow for various variations or alterations of the configuration without departing from the spirit or scope of this invention as defined by the appended claims.

REFERENCE NUMERAL

A10, A20, A21, A22, A30 semiconductor device
10 substrate
11 collector layer
11A collector primary face
12 base layer
12A base primary face
13 emitter layer
13A emitter primary face
131 bump
20 insulating layer
21 lower insulating layer
21A first step difference
21B second step difference
211 first lower opening
212 second lower opening
213 third lower opening
22 upper insulating layer
221 first upper opening
222 second upper opening
223 third upper opening
224 upper fourth opening
225 upper fifth opening
31 first electrode
311 first terminal portion
312 first conductive portion
313 first bonding pad portion
314 bump
315A first recess
315B second recess
32 second electrode
321 second terminal portion
322 second conductive portion
323 second bonding pad portion
324 recess
33 third electrode
34 first wiring layer
341 main body
342 third conductive portion
343 third bonding pad portion
344 recess
35 second wiring layer
351 band
352 emitter connection portion
41 first resistor component
42 second resistor component
50 protection component
51 contact
52 ring
521 first ring
522 second ring
531 first diffusion layer
532 second diffusion layer
60 protection layer
70 auxiliary protection component
71 auxiliary contact
72 auxiliary ring
721 first auxiliary ring
722 second auxiliary ring
z thickness direction
x first direction
y second direction

What is claimed is:

1. A semiconductor device, comprising,
a collector layer, which is a first conductivity type semiconductor;
a base layer, which is a second conductivity type semiconductor and connected with the collector layer;
an emitter layer, which is the first conductivity type semiconductor and connected with the base layer;

a first electrode, electrically connected to the base layer, wherein at least a portion of the first electrode overlaps with the base layer from a top view perspective of the semiconductor device;
a first resistor component, connected in series with the first electrode in a conductive path connecting the first electrode and the base layer;
a second electrode, electrically connected to the emitter layer and the first resistor component; and
a protection component, connected to the first electrode in parallel with the first resistor component;
wherein the protection component comprises a pair of diodes formed by a pn junction and by a way of making both ends of the conductive path into a same polarity.

2. The semiconductor device of claim 1, further comprising an insulating layer, wherein the insulating layer is disposed over the collector layer, and is connected with the collector layer, the base layer and the emitter layer; and
the first electrode is disposed on the insulating layer.

3. The semiconductor device of claim 2, further comprising a first wiring layer, wherein the first wiring layer is connected in series with the first resistor component and disposed on the insulating layer; and
the first wiring layer is connected with the base layer.

4. The semiconductor device of claim 3, wherein the material for forming the first resistor component comprises polycrystalline silicon.

5. The semiconductor device of claim 4, wherein
the protection component is disposed between the base layer and the first electrode and is connected with the base layer and the first electrode.

6. The semiconductor device of claim 4, wherein,
the protection component is disposed between the collector layer and the first electrode and connected with the first electrode,
the semiconductor device further comprises a second wiring layer electrically conducting the protection component with the second electrode, and
the second wiring layer is the second conductivity type semiconductor and also comprises a portion of the protection component.

7. The semiconductor device of claim 3, wherein
the protection component is disposed between the base layer and the first electrode and is connected with the base layer and the first electrode.

8. The semiconductor device of claim 7, wherein the protection component comprises, a contact, which is the second conductivity type semiconductor and is connected with the base layer; and a plurality of rings, which surrounds the contact respectively from the top view perspective; wherein,
the plurality of the rings comprises, a plurality of first rings, which are the first conductivity type semiconductor; and a plurality of second rings, which are the second conductivity type semiconductor; and the plurality of the first rings and the plurality of the second rings are disposed alternately, wherein
the innermost one of the plurality of the rings is a first ring and connected with the contact portion from the top view perspective,
the outermost one of the plurality of the rings is a second ring and connected with the first electrode and the first resistor component from the top view perspective.

9. The semiconductor device of claim 8, wherein the base layer comprises a portion of the protection component.

10. The semiconductor device of claim 7, wherein the first resistor component and the protection component are covered by the insulating layer.

11. The semiconductor device of claim 10, wherein the material forming the protection component comprises polycrystalline silicon.

12. The semiconductor device of claim 7, further comprising a second resistor component, wherein,
the second resistor component is connected in series with the first resistor component, and is in a conductive path of the first resistor component and the second electrode; and
the material forming the second resistor component comprises polycrystalline silicon.

13. The semiconductor device of claim 12, further comprising a third electrode, disposed directly under and electrically connected to the collector layer.

14. The semiconductor device of claim 3, wherein,
the protection component is between the collector layer and the first electrode and is connected with the first electrode,
the semiconductor device further comprises a second wiring layer electrically connecting the protection component with the second electrode, and
the second wiring layer is the second conductivity type semiconductor and comprises a portion of the protection component.

15. The semiconductor device of claim 14, wherein, the protection component comprises, a contact, which is the second conductivity type semiconductor and is connected with the base layer; and a plurality of rings, which respectively surrounds the contact from the top view perspective; wherein,
the plurality of the rings comprises, a plurality of first rings, which are the first conductivity type semiconductor; and a plurality of second rings, which are the second conductivity type semiconductor, wherein the plurality of the first rings and the plurality of the second rings are disposed alternately, wherein
the innermost one of the plurality of the rings is a first ring portion and connected with the contact portion from the top view perspective,
the outermost one of the plurality of the rings is a second ring portion and connected with the second wiring layer from the top view perspective.

16. The semiconductor device of claim 15, wherein the second wiring layer comprises a band, which intersects with the first wiring layer, and the band is covered by the insulating layer from the top view perspective.

17. The semiconductor device of claim 3, wherein,
the protection component is connected with the collector layer, and
the collector layer comprises a portion of the protection component.

18. The semiconductor device of claim 17, further comprising an auxiliary protection component, wherein
the auxiliary protection component is disposed between the protection component and the first electrode and is connected with the protection component and the first electrode,
the auxiliary protection component comprises an auxiliary contact, which is the first conductivity type semiconductor, and is connected with the protection component; and a plurality of auxiliary rings, which surrounds the auxiliary contact respectively from the top view perspective; wherein the plurality of the auxiliary rings comprises, a plurality of first auxiliary rings, which are the second conductivity type semiconductor; and a plurality of second auxiliary rings, which are the first conductivity type semiconductor, wherein the plurality of the first auxiliary rings and the plurality of the second auxiliary rings are disposed alternately, the innermost one of the auxiliary rings is a first auxiliary ring portion and connected with the auxiliary contact portion from the top view perspective, the outermost one of the auxiliary rings is a first auxiliary ring and connected with the first electrode and the first resistor component from the top view perspective.

19. The semiconductor device of claim 18, wherein the first resistor component and the auxiliary protection component are covered by the insulating layer.

20. The semiconductor device of claim 19, wherein the material of the auxiliary protection component comprises polycrystalline silicon.

21. The semiconductor device of claim 2, wherein the first resistor component is between a portion of the insulating layer and the collector layer.

22. The semiconductor device of claim 1, wherein at least a portion of the protection component is above a top surface of the base layer.

* * * * *